(12) United States Patent
Kim et al.

(10) Patent No.: US 11,545,211 B2
(45) Date of Patent: Jan. 3, 2023

(54) SEMICONDUCTOR MEMORY DEVICE AND A METHOD OF OPERATING THE SEMICONDUCTOR MEMORY DEVICE

(71) Applicant: SAMSUNG ELECTRONICS CO., LTD., Suwon-si (KR)

(72) Inventors: Kiheung Kim, Suwon-si (KR); Junhyung Kim, Suwon-si (KR); Sungchul Park, Seoul (KR); Hangyun Jung, Seoul (KR); Hyojin Jung, Hwaseong-si (KR); Kyungsoo Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/400,585

(22) Filed: Aug. 12, 2021

(65) Prior Publication Data

US 2022/0208252 A1 Jun. 30, 2022

(30) Foreign Application Priority Data

Dec. 30, 2020 (KR) .................. 10-2020-0187230

(51) Int. Cl.
*G11C 11/4091* (2006.01)
*G11C 11/408* (2006.01)
*G06F 7/58* (2006.01)
*G11C 11/402* (2006.01)

(52) U.S. Cl.
CPC .......... *G11C 11/4091* (2013.01); *G06F 7/588* (2013.01); *G11C 11/408* (2013.01); *G11C 11/4023* (2013.01)

(58) Field of Classification Search
CPC ............ G11C 11/4091; G11C 11/4023; G11C 11/408; G06F 7/588
See application file for complete search history.

(56) References Cited

U.S. PATENT DOCUMENTS

| 7,424,500 | B2 | 9/2008 | Fukushima et al. |
| 8,154,918 | B2 | 4/2012 | Sharon et al. |
| 9,202,556 | B1* | 12/2015 | Kim .................. G11C 7/222 |
| 9,965,205 | B2 | 5/2018 | Kim et al. |

(Continued)

FOREIGN PATENT DOCUMENTS

| JP | 4251759 | 1/2009 |
| KR | 10-2007-0107415 | 11/2007 |

*Primary Examiner* — Ajay Ojha
(74) *Attorney, Agent, or Firm* — F. Chau & Associates, LLC

(57) ABSTRACT

A semiconductor memory device includes a memory cell array, a sense amplifier circuit and a random code generator. The memory cell array is divided into a plurality of sub array blocks arranged in a first direction and a second direction crossing the first direction. The sense amplifier circuit is arranged in the second direction with respect to the memory cell array, and includes a plurality of input/output (I/O) sense amplifiers. The random code generator generates a random code which is randomly determined based on a power stabilizing signal and an anti-fuse flag signal. A second group of I/O sense amplifiers selected from among a first group of I/O sense amplifiers performs a data I/O operation by data scrambling data bits of main data. The first group of I/O sense amplifiers correspond to a first group of sub array blocks accessed by an access address.

20 Claims, 23 Drawing Sheets

(56) References Cited

U.S. PATENT DOCUMENTS

| | | |
|---|---|---|
| 10,635,400 B2 | 4/2020 | Sharon et al. |
| 2010/0070682 A1* | 3/2010 | Wan .................... G06F 12/0246 |
| | | 711/E12.008 |
| 2013/0094320 A1* | 4/2013 | Yoo ......................... G06F 12/02 |
| | | 365/230.01 |
| 2014/0115234 A1 | 4/2014 | Woo et al. |
| 2018/0090221 A1* | 3/2018 | Kim ....................... G11C 17/16 |
| 2020/0027497 A1* | 1/2020 | Shin ...................... G06F 3/0659 |

* cited by examiner

FIG. 13

| RDCD0 | RDCD1 | HALF DQ |
|---|---|---|
| - | - | 0 |
| L | L | 2 |
| L | H | 4 |
| H | L | 6 |
| H | H | 8 |

SEMICONDUCTOR MEMORY DEVICE AND A METHOD OF OPERATING THE SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2020-0187230, filed on Dec. 30, 2020 in the Korean Intellectual Property Office, the disclosure of which is incorporated by reference herein in its entirety.

TECHNICAL FIELD

Example embodiments of the inventive concept relate to memory devices. More particularly, example embodiments of the inventive concept relate to semiconductor memory devices and methods of operating semiconductor memory devices.

DISCUSSION OF RELATED ART

Semiconductor memory devices may be classified as non-volatile memory devices, such as flash memory devices, and volatile memory devices, such as dynamic random access memory (DRAM) devices. DRAM devices are often used for system memories due to their high-speed operation and cost efficiency. There has been an increasing demand for a reduction in size of DRAM devices. However, because of this demand, a capacitance of a capacitor in a memory cell may decrease and memory noise may increase based on a format of data to be stored in a semiconductor memory device.

SUMMARY

Embodiments of the inventive concept provide a semiconductor memory device with enhanced operating characteristics, and a method of operating the same.

According to an embodiment of the inventive concept, a semiconductor memory device includes a memory cell array, a sense amplifier circuit, and a random code generator. The memory cell array includes a plurality of sub array blocks arranged in a first direction and a second direction crossing the first direction. The sense amplifier circuit is arranged in the first direction and includes a plurality of input/output (I/O) sense amplifiers corresponding to the sub array blocks arranged in the second direction. The random code generator is configured to generate a random code which is randomly determined based on a power stabilizing signal and an anti-fuse flag signal, the power stabilizing signal indicating that an operating voltage generated based on an external voltage received during a power-up sequence of the semiconductor memory has reached a reference voltage level, the anti-fuse flag signal indicating that information associated with an anti-fuse circuit of the semiconductor memory device has been transferred. A first group of I/O sense amplifiers from among the plurality of I/O sense amplifiers is configured to perform a data I/O operation on main data. The first group of I/O sense amplifiers corresponds to a first group of sub array blocks from among the plurality of sub array blocks. The first group of sub array blocks is accessed via an access address. A second group of I/O sense amplifiers is selected from among the first group of I/O sense amplifiers and is configured to perform the data I/O operation by data scrambling data bits of the main data.

According to an embodiment of the incentive concept, a method of operating a semiconductor memory device includes: generating, by a random code generator included in the semiconductor memory device and during a power-up sequence of the semiconductor memory device, a counting signal by counting oscillations of a clock signal; generating, by the random code generator, a random code by latching the counting signal based on a signal generated in response to an end of the power-up sequence, the signal belonging to a second domain different from a first domain to which the clock signal belongs; and scrambling data bits of data input to and/or output from a second group of sub array blocks selected from among a first group of sub array blocks based on the random code. The first group of sub array blocks are included in a plurality of sub array blocks included in a memory cell array of the semiconductor memory device, the plurality of sub array blocks are arranged in a first direction and a second direction crossing the first direction, and the first group of sub array blocks are arranged in the second direction.

According to an embodiment of the inventive concept, a semiconductor memory device includes a memory cell array, a sense amplifier circuit, and a random code generator. The memory cell array includes a plurality of sub array blocks arranged in a first direction and a second direction crossing the first direction. The sense amplifier circuit is arranged in the first direction and includes a plurality of input/output (I/O) sense amplifiers corresponding to the sub array blocks arranged in the second direction. The random code generator is configured to generate a random code which is randomly determined based on a power stabilizing signal and an anti-fuse flag signal, the power stabilizing signal indicating that an operating voltage generated based on an external voltage received during a power-up sequence of the semiconductor memory has reached a reference voltage level, the anti-fuse flag signal indicating that information associated with an anti-fuse circuit of the semiconductor memory device has been transferred. A first group of I/O sense amplifiers from among the plurality of I/O sense amplifiers is configured to perform a data I/O operation on main data. The first group of I/O sense amplifiers corresponds to a first group of sub array blocks from among the plurality of sub array blocks. The first group of sub array blocks is accessed via an access address. A second group of I/O sense amplifiers is selected from among the first group of I/O sense amplifiers and is configured to perform the data I/O operation by data scrambling data bits of the main data. The random code generator includes an oscillator, a counter, a latch circuit, and a selection circuit. The oscillator is configured to generate a clock signal during an initial interval of the power-up sequence in response to the power stabilizing signal. The counter is configured to generate a counting signal by counting oscillations of the clock signal. The latch circuit is configured to provide a latched counting signal by latching the counting signal based on the anti-fuse flag signal. The selection circuit is configured to select one of the latched counting signal and a test code in response to a selection signal and to output the selected latched counting signal or the selected test code as the random code.

BRIEF DESCRIPTION OF THE DRAWINGS

The above and other features of the inventive concept will become more apparent by describing in detail embodiments thereof with reference to the accompanying drawings, in which:

FIG. 13 is a table illustrating a selection of I/O sense amplifiers to be included in a second group of I/O sense amplifiers which may perform data scrambling;

DETAILED DESCRIPTION

Figure 1:
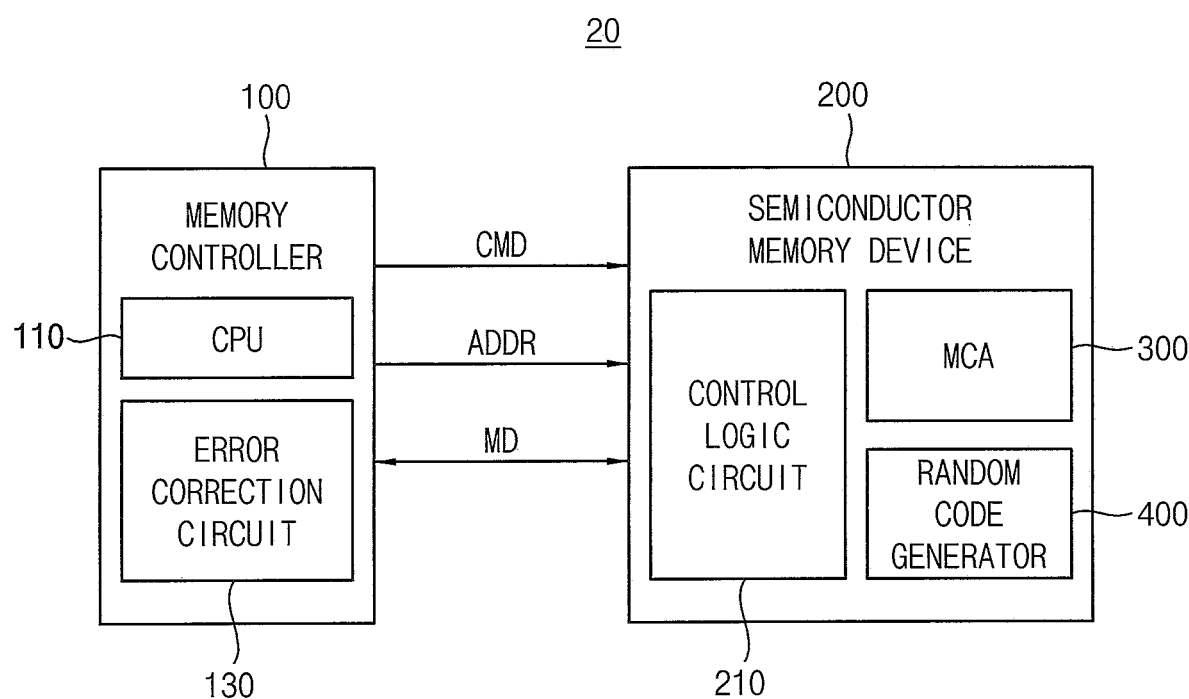
FIG. 1 is a block diagram of a memory system according to an embodiment of the inventive concept.

Embodiments of the inventive concept will be described more fully hereinafter with reference to the accompanying drawings. Like reference numerals may refer to like elements throughout the accompanying drawings.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

As is traditional in the field of the inventive concept, embodiments are described and illustrated in the drawings in terms of functional blocks, units, and/or modules. Those skilled in the art will appreciate that these blocks, units, and/or modules may be physically implemented by electronic (or optical) circuits such as logic circuits, discrete components, microprocessors, hard-wired circuits, memory elements, wiring connections, etc.

FIG. 1 is a block diagram of a memory system 20 according to an embodiment of the inventive concept.

Referring to FIG. 1, a memory system 20 may include a memory controller 100 (e.g., an external memory controller) and at least one semiconductor memory device 200. The memory controller 100 may be an integrated circuit formed in a semiconductor chip (also referred to herein as a "die"). The semiconductor memory device 200 may be formed as a semiconductor chip.

The memory controller 100 may control the overall operation of the memory system 20. The memory controller 100 may control the overall data exchange between an external host and the semiconductor memory device 200. For example, the memory controller 100 may write data in the semiconductor memory device 200 or read data from the semiconductor memory device 200 in response to a request from the host. In addition, the memory controller 100 may control the semiconductor memory device 200 by issuing operation commands to the semiconductor memory device 200.

In some embodiments, the semiconductor memory device 200 may be a memory device, including a plurality of dynamic (volatile) memory cells, such as a dynamic random access memory (DRAM) device, DDR5 (double data rate) synchronous DRAM (SDRAM) device, DDR6 (double data rate) synchronous DRAM (SDRAM) device, or a stacked memory device. For example, a stacked memory device may be a high bandwidth memory (HBM) device.

The memory controller 100 may transmit a command CMD and an address ADDR to the semiconductor memory device 200 and exchange main data MD with the semiconductor memory device 200.

The memory controller 100 may include a central processing unit (CPU) 110 and an error correction circuit 130. As explained below, the semiconductor memory device 200 may include an error correction circuit 330, and so the error correction circuit 330 may be referred to as a first error correction circuit and the error correction circuit 130 in the memory controller 100 may be referred to as a second error correction circuit.

The CPU 110 may control overall operation of the memory controller 100.

The error correction circuit 130 may generate parity data based on the main data MD to be transmitted to the semiconductor memory device 200. The error correction circuit 130 may store the parity data, may generate check bits based on the main data MD when the main data MD is received from the semiconductor memory device 200, and may correct error bits in the main data MD received from the semiconductor memory device 200 based on a comparison of the parity data and the check bits.

The semiconductor memory device 200 may include a memory cell array (MCA) 300 that stores the main data MD, a random code generator 400, and a control logic circuit 210.

The memory cell array 300 may include a plurality of sub array blocks arranged in a first direction and a second direction crossing the first direction, as will be described in further detail with reference to FIG. 7.

The random code generator 400 may generate a random code which may be randomly determined based on a power stabilizing signal and an anti-fuse flag signal. The power stabilizing signal may indicate that an operating voltage, generated based on an external voltage received from an outside source during a power-up sequence of the semiconductor memory device 200, has reached a reference voltage level, and the anti-fuse flag signal may indicate that information associated with an anti-fuse circuit of the semiconductor memory device 200 has been transferred to the anti-fuse circuit.

The semiconductor memory device 200 may perform a burst operation. As used herein, a burst operation refers to an operation of writing or reading a large amount of data by sequentially increasing or decreasing an initial address provided from the memory controller 100. A basic unit of the burst operation may be referred to as a burst length. In some embodiments, the burst length may refer to the number of operations of continuously reading or writing data by sequentially increasing or decreasing the initial address. The main data MD in the memory system 20 of FIG. 1 may correspond to a plurality of burst lengths.

Figure 2:
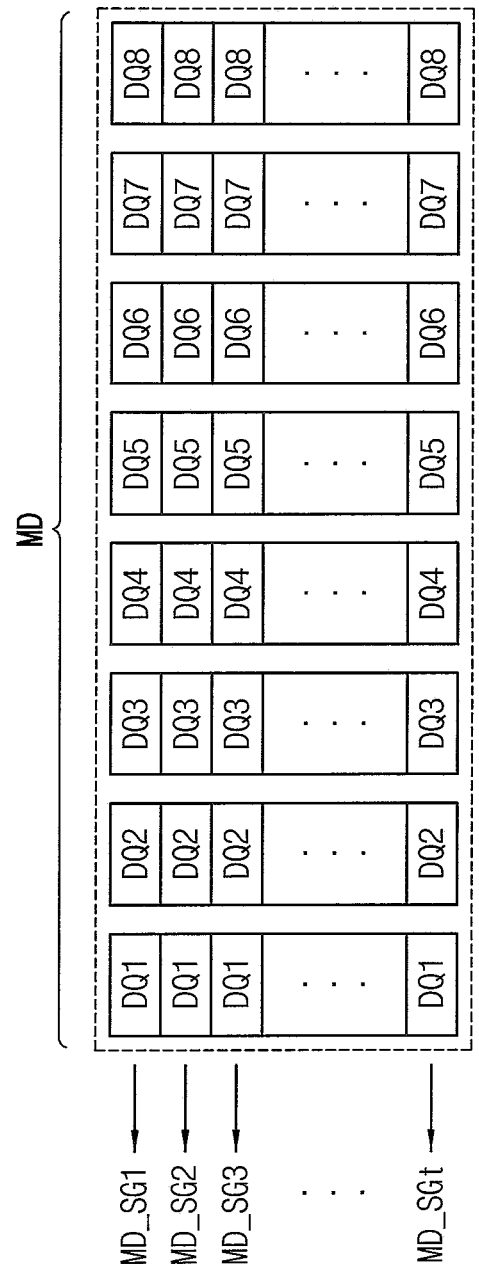
FIG. 2 illustrates a main data corresponding to a plurality of burst lengths in the memory system of FIG. 1 according to an embodiment of the inventive concept.

FIG. 2 illustrates a main data MD corresponding to a plurality of burst lengths in the memory system 20 of FIG. 1 according to an embodiment of the inventive concept.

Referring to FIG. 2, the main data MD corresponding to the plurality of burst lengths are input to and/or output from the semiconductor memory device 200. The main data MD may include data segments MD_SG1 to MD_SGt, where t may be a natural number equal to or greater than 8. Each data segment MD_SG1 to MD_SGt may correspond to a burst length among the plurality of burst lengths. The burst length is assumed to be 8 in FIG. 2. However, embodiments of the inventive concept are not limited thereto. The main data MD corresponding to the plurality of burst lengths may be stored in the memory cell array 300 of the semiconductor memory device 200.

Figure 3:
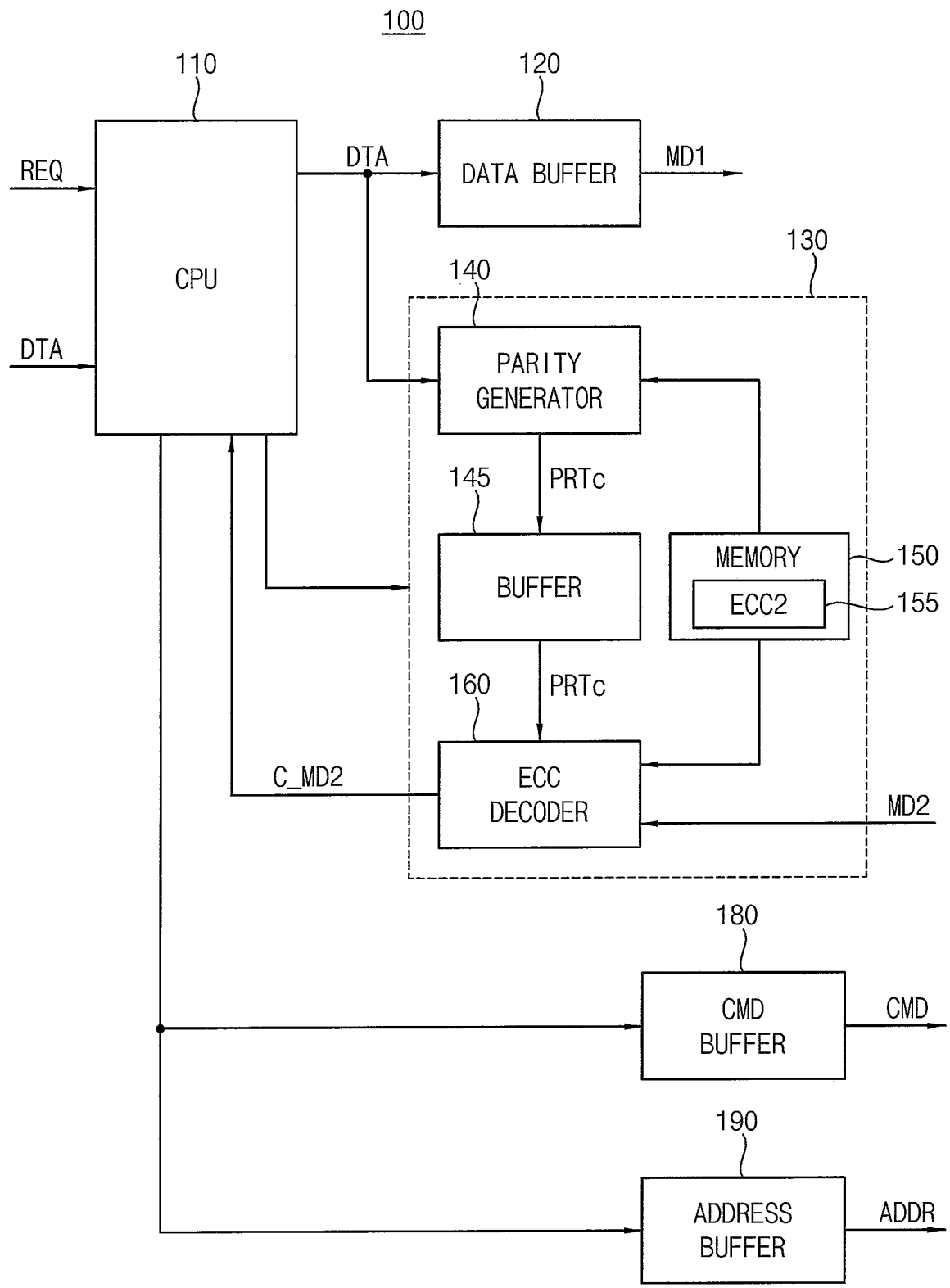
FIG. 3 is a block diagram of a memory controller of FIG. 1 according to an embodiment of the inventive concept.

FIG. 3 is a block diagram of the memory controller 100 of FIG. 1 according to an embodiment of the inventive concept.

Referring to FIG. 3, the memory controller 100 may include the CPU 110, a data buffer 120, the error correction circuit 130, a command buffer 180, and an address buffer 190. The error correction circuit 130 may include a parity generator 140, a buffer 145, an error correction code (ECC) memory 150 storing a second ECC ECC2 155, and an ECC decoder 160.

The CPU 110 may control the data buffer 120, the error correction circuit 130, the command buffer 180, and the address buffer 190. The CPU 110 may receive a request REQ and data DTA from the host, and may provide the data DTA to the data buffer 120 and the parity generator 140.

The data buffer 120 may provide a first main data MD1 to the semiconductor memory device 200 by buffering the data DTA.

The parity generator 140 may be connected to the ECC memory 150, may generate a system parity data PRTc by ECC encoding the data DTA, and may store the system parity data PRTc in the buffer 145.

The ECC decoder 160 may receive a second main data MD2 from the semiconductor memory device 200 in a read operation of the semiconductor memory device 200. The ECC decoder 160 may ECC decode the second main data MD2 with the second ECC ECC2 155 and the system parity data PRTc and may provide a corrected main data C_MD2 based on the decoded second main data MD2 to the CPU 110. The CPU 110 may provide the corrected main data C_MD2 to the host.

The command buffer 180 may store the command CMD corresponding to the request REQ and transmit the command CMD to the semiconductor memory device 200 under control of the CPU 110. The address buffer 190 may store the address ADDR and transmit the address ADDR to the semiconductor memory device 200 under control of the CPU 110.

Figure 4:
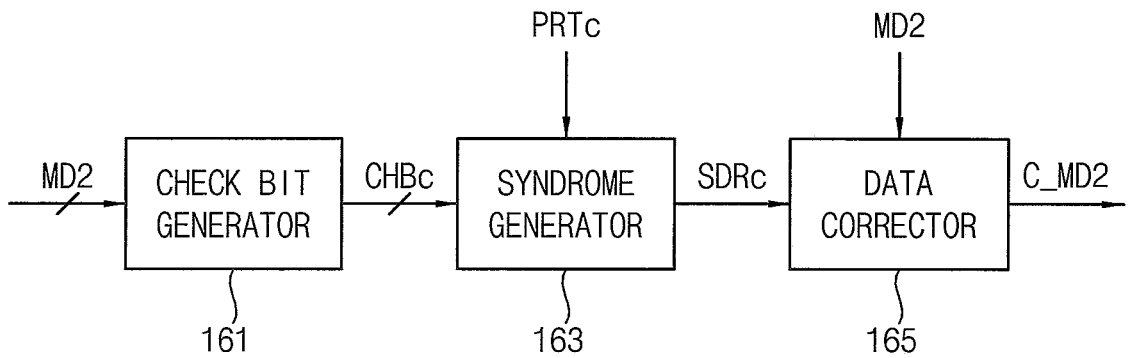
FIG. 4 is a block diagram of an ECC decoder of FIG. 3 according to an embodiment of the inventive concept.

FIG. 4 is a block diagram of the ECC decoder 160 of FIG. 3 according to an embodiment of the inventive concept.

Referring to FIG. 4, the ECC decoder 160 may include a check bit generator 161, a syndrome generator 163, and a data corrector 165.

The check bit generator 161 may read the second main data MD2 from the semiconductor memory device 200 and generate a plurality of check bits CHBc corresponding to the second main data MD2 with the second ECC ECC2 155.

The syndrome generator 163 may generate syndrome data SDRc by comparing the system parity data PRTc and the plurality of check bits CHBc based on symbols. The syndrome data SDRc may indicate whether the second main data MD2 includes at least one error bit, and may also indicate a position of the at least one error bit. The data corrector 165 may receive the second main data MD2, correct the at least one error bit in the second main data MD2 based on the syndrome data SDRc, and output the corrected main data C_MD2 based on the corrected at least one error bit in the second main data MD2.

Figure 5:
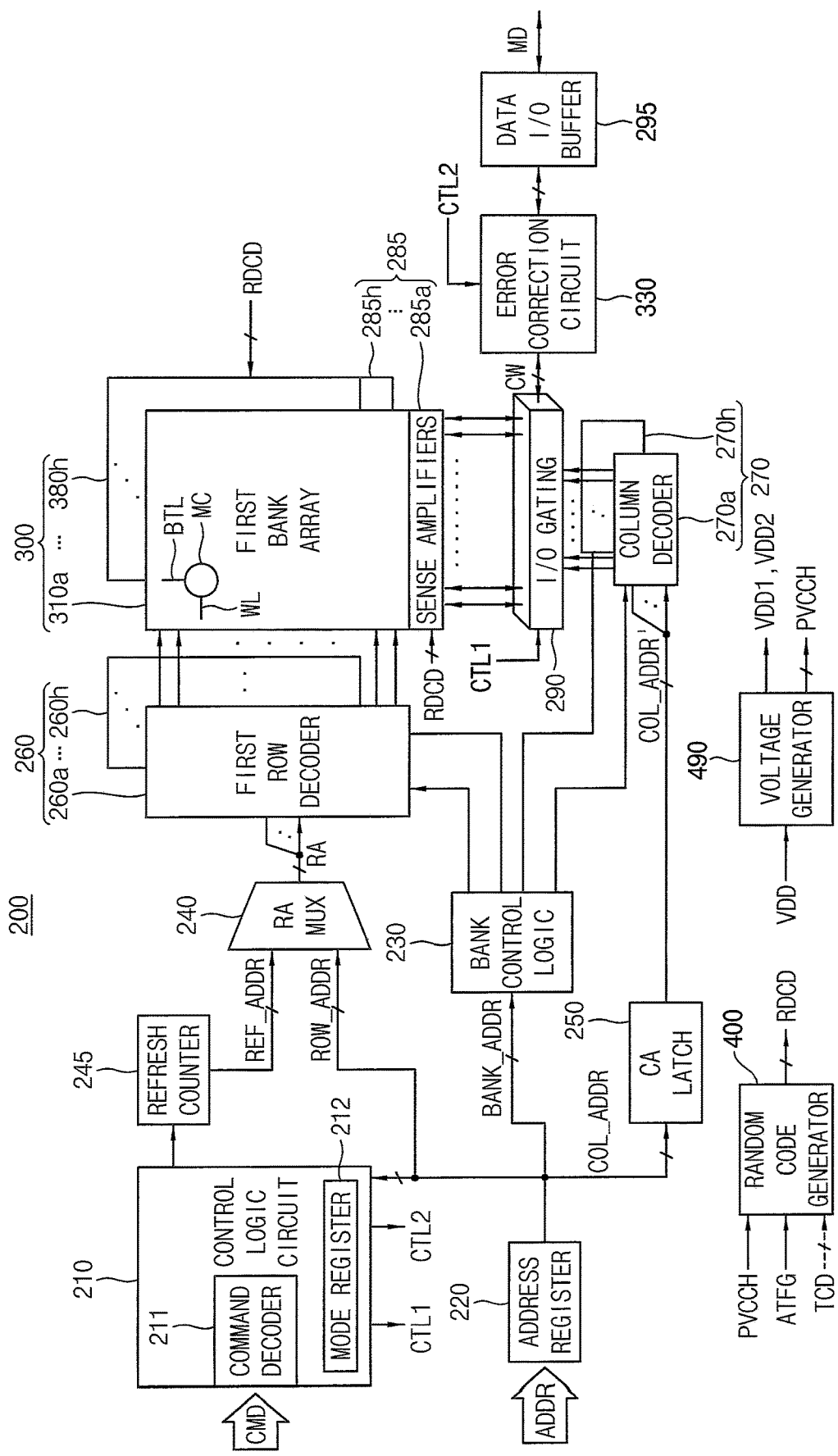
FIG. 5 is a block diagram of a semiconductor memory device of FIG. 1 according to an embodiment of the inventive concept.

FIG. 5 is a block diagram of the semiconductor memory device 200 of FIG. 1 according to an embodiment of the inventive concept.

Referring to FIG. 5, the semiconductor memory device 200 may include the control logic circuit 210, an address register 220, a bank control logic 230, a row address multiplexer 240, a refresh counter 245, a column address latch 250, a row decoder 260, a column decoder 270, a sense amplifier circuit 285, an input/output (I/O) gating circuit 290, a data I/O buffer 295, the memory cell array 300, the error correction circuit 330, the random code generator 400, and a voltage generator 490.

The memory cell array 300 may include first through eighth bank arrays 310*a* to 310*h*. The row decoder 260 may include first through eighth row decoders 260*a* to 260*h* respectively coupled to the first through eighth bank arrays 310a to 310h. The column decoder 270 may include first through eighth column decoders 270a to 270h respectively coupled to the first through eighth bank arrays 310a to 310h. The sense amplifier circuit 285 may include first through eighth sense amplifiers 285a to 285h respectively coupled to the first through eighth bank arrays 310a to 310h.

The first through eighth bank arrays 310a to 310h, the first through eighth row decoders 260a to 260h, the first through eighth column decoders 270a to 270h, and first through eighth sense amplifiers 285a to 285h may form first through eighth banks.

Each of the first through eighth bank arrays 310a to 310h may include a plurality of word lines WL, a plurality of bit lines BTL, and a plurality of memory cells MC, which may be formed at intersections of the word lines WL and the bit lines BTL. Each of the memory cells MC may be a volatile memory cell having a DRAM cell configuration. In addition, each of the first through eighth bank arrays 310a to 310h may be divided into a plurality of sub array blocks arranged in the first direction and the second direction crossing the first direction.

Although the semiconductor memory device 200 is illustrated in FIG. 5 as including eight banks, embodiments of the inventive concept are not limited thereto, and the semiconductor memory device 200 may include any number of banks.

The control logic circuit 210 may receive a command CMI) from the memory controller 100. The address register 220 may receive an address ADDR including at least one bank address BANK_ADDR, at least one first row address ROW_ADDR, and at least one first column address COL_ADDR from the memory controller 100. The address register 220 may provide the received bank address BANK_ADDR to the bank control logic 230, the received row address ROW_ADDR to the row address multiplexer 240, and the received first column address COL_ADDR to the column address latch 250. The address ADDR may be referred to as "an access address".

The bank control logic 230 may generate bank control signals in response to the bank address BANK_ADDR. One of the first through eighth row decoders 260a to 260h corresponding to the bank address BANK_ADDR may be activated in response to the bank control signals, and one of the first through eighth column decoders 270a to 270h corresponding to the bank address BANK_ADDR may be activated in response to the bank control signals.

The row address multiplexer 240 may receive the first row address ROW_ADDR from the address register 220 and a refresh row address REF_ADDR from the refresh counter 245. The row address multiplexer 240 may selectively output one of the at least one first row addresses ROW_ADDR and the refresh row address REF_ADDR as at least one second row address RA. The second row address RA that is output from the row address multiplexer 240 may be applied to the first through eighth row decoders 260a to 260h.

The activated row decoder of the first through eighth row decoders 260a to 260h may decode the second row address RA that is output from the row address multiplexer 240, and may activate a word line corresponding to the second row address RA. For example, the activated bank row decoder may apply a word line driving voltage to the word line corresponding to the second row address RA.

The column address latch 250 may receive the first column address COL_ADDR from the address register 220, and may temporarily store the received first column address COL_ADDR as at least one second column address COL_ADDR'. In some embodiments, in a burst mode, the column address latch 250 may generate the at least one second column addresses COL_ADDR' by incrementing the received first column address COL_ADDR. The column address latch 250 may apply the temporarily stored or generated second column address COL_ADDR' to the first through eighth bank column decoders 270a to 270h.

The activated column decoder of the first through eighth column decoders 270a to 2'70h may decode the second column address COL_ADDR' that is output from the column address latch 250, and may output, via the I/O gating circuit 290, data corresponding to the column address COL_ADDR' received from the column address latch 250. The activated one of the first through eighth bank column decoders 270a to 270h may alternatively output, via control the I/O gating circuit 290, data corresponding to a mapped column address MCA.

The I/O gating circuit 290 may include circuitry which may gate input/output data. The I/O gating circuit 290 may further include read data latches which may store data that is output from the first through eighth bank arrays 310a to 310h, and write drivers which may write data to the first through eighth bank arrays 310a to 310h.

A codeword CW may be sensed from one bank array of the first through eighth bank arrays 310a to 310h via a sense amplifier of the first through eighth sense amplifiers 285a to 285h in the sense amplifier circuit 285 coupled to the bank array 300 and may be stored in the read data latches of the I/O gating circuit 290. The codeword. CW stored in the read data latches may be ECC decoded by the error correction circuit 330 and may be provided to the memory controller 100 via the data I/O buffer 295.

The main data MD may be provided to the data I/O buffer 295 from the memory controller 100 and may be written in one bank array of the first through eighth bank arrays 310a to 310h. The main data MD may be provided from the data I/O buffer 295 to the error correction circuit 330.

The error correction circuit 330 may generate parity data by ECC encoding the main data MD and provide the I/O gating circuit 290 with the codeword CW, including the main data MD and the parity data.

In some embodiments, the error correction circuit 330 may ECC encode and ECC decode with a first ECC ECC1, which may be represented by a generation matrix.

The control logic circuit 210 may control operations of the semiconductor memory device 200. For example, the semiconductor memory device 200 may perform a write operation or a read operation based on control signals generated by the control logic 210. The control logic circuit 210 may include a command decoder 211 which may decode the command CMD received from the memory controller 100, and a mode register 212 which may set an operation mode of the semiconductor memory device 200. That is, the control logic circuit 210 may control the semiconductor memory device 200 based on the command CMD and the address received from outside the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may control the I/O gating circuit 290 based on a first control signal CTL1 and may control the error correction circuit 330 based on a second control signal CTL2.

The voltage generator 490 may generate operating voltages VDD1 and VDD2 based on an external voltage VDD received from an outside device during a power-up sequence of the semiconductor memory device 200, may generate a power stabilizing signal PVCCH indicating that an operating voltage has reached a reference voltage level, and may provide the power stabilizing signal PVCCH to the random code generator 400.

The random code generator 400 may generate a random code RDCD which may be randomly determined based on the power stabilizing signal PVCCH and anti-fuse flag signal ATFG during the power-up sequence of the semiconductor memory device 200, and may provide the random code RDCD to the sense amplifier circuit 285. The anti-fuse flag signal ATFG may indicate that information associated with an anti-fuse circuit of the semiconductor memory device 200 has been transferred to the anti-fuse circuit. The random code generator 400 may generate the random code RDCD based on a test code TCD.

Each sense amplifier of the sense amplifiers 285a to 285h in the sense amplifier circuit 285 may include a plurality of I/O sense amplifiers, and a first group of I/O sense amplifiers from among the plurality of I/O sense amplifiers may perform an I/O operation on the main data MD. The random code RDCD may select a second group of I/O sense amplifier from among the first group of I/O sense amplifiers. The second group of I/O sense amplifiers may data scramble data bits of the main data MD during the data I/O operation by inverting a portion of data bits of the main data MD.

The random code generator 400 may retain random bits of the random code RDCD during a normal operation of the semiconductor memory device 200. The random code generator 400 may update random bits of the random code RDCD during a warm boot or a cold boot of the semiconductor memory device 200.

For example, when a setting condition of the mode register 212 and a rebooting condition of the mode register 212 are both within a predetermined error range, the semiconductor memory device 200 may perform a rebooting operation based on information stored in the mode register 212. For ease of description, a rebooting operation executed based on the information stored in the mode register 212 may be referred to as a warm boot.

As another example, when the setting condition of the mode register 212 and the rebooting condition of the mode register 212 are not both within the predetermined error range, the semiconductor memory device 200 may newly setting information stored in the mode register 212. For example, a rebooting operation executed by newly setting information of the mode register 212 may be referred to as a cold boot.

The semiconductor memory device 200 is illustrated in FIG. 5 as including a random code generator 400. In an embodiment, the random code generator 400 may provide a random code RDCD to the sense amplifiers 285a to 285h, and may provide the random code RDCD to the first through eighth bank arrays 310a to 310h.

In some embodiments, a plurality of random code generators respectively corresponding to the bank arrays 310a to 310h may be disposed in the semiconductor memory device 200, and each of the plurality of random code generators may respectively generate a different random code for each of the bank arrays 310a to 310h.

Figure 6:
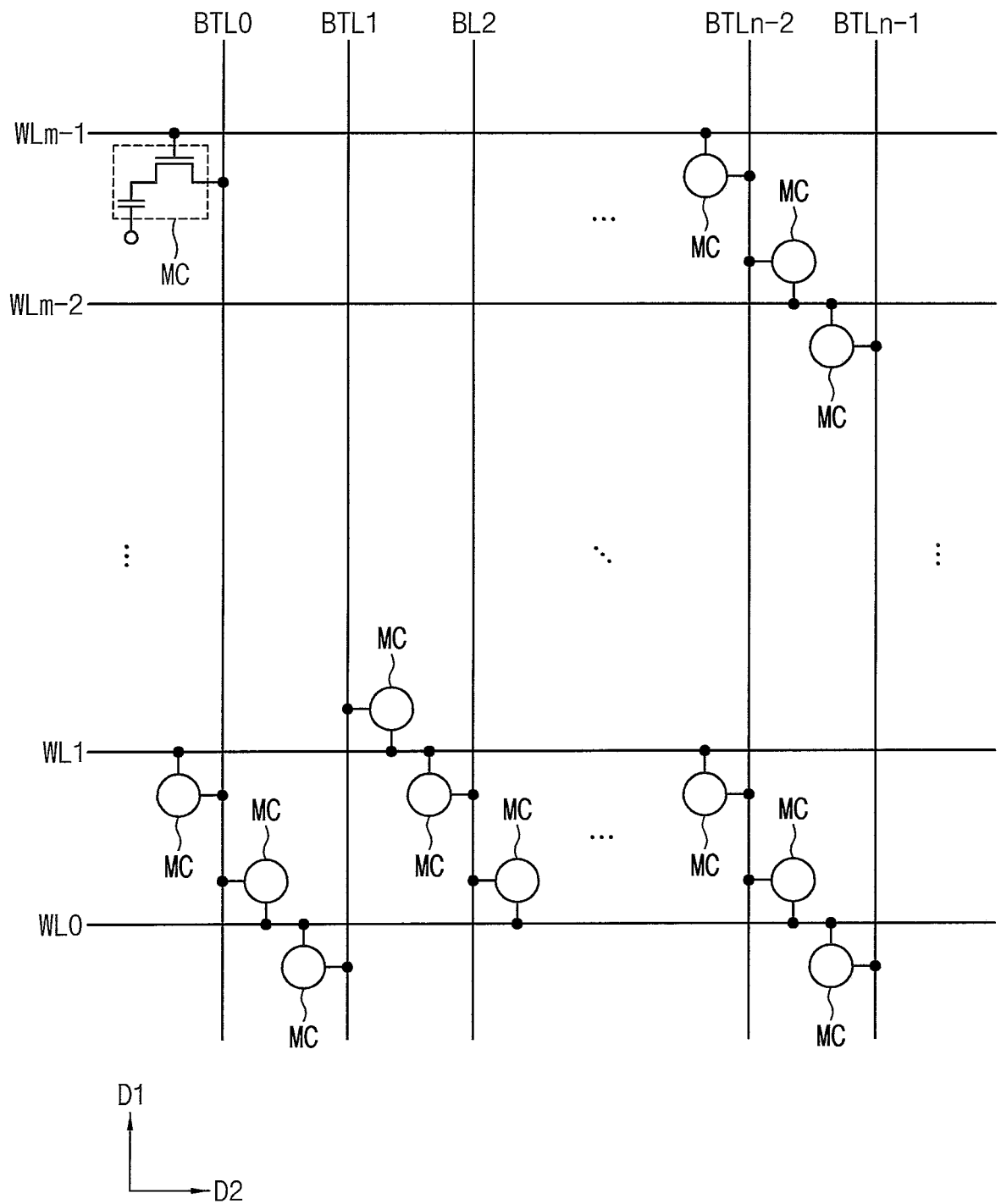
FIG. 6 is a diagram of a first bank array in the semiconductor memory device of FIG. 5 according to an embodiment of the inventive concept.

FIG. 6 is a diagram of the first bank array 310a of the semiconductor memory device 200 of FIG. 5 according to an embodiment of the inventive concept. The first bank arrays 310a may be representative of the first through eighth bank arrays 310a to 310h.

Referring to FIG. 6, the first bank array 310a may include a plurality of word lines WL0 to WLm-1, where in is an even integer equal to or greater than two, a plurality of hit lines BTL0 to BTLn-1 where n is an even integer equal to or greater than two, and a plurality of memory cells MC disposed at intersections between the word lines WL0 to WLm-1 and the hit lines BTL0 to BTLn-1. Each memory cells MC may include an access (cell) transistor coupled to one of the word lines WL0 to WLm-1 and one of the bit lines BTL0 to BTLn-1, and may include a storage (cell) capacitor coupled to the cell transistor. For example, each memory cells MC may include a DRAM cell.

In addition, the arrangement of the plurality of memory cells MC may differ based on whether a memory cells MC is coupled to an even word line (for example, WL0) or to an odd word line (for example, WL1). For example, a bit line coupled to adjacent memory cells MC may be selected based on whether a word lint selected by an access address is an even word line or an odd word line.

Figure 7:
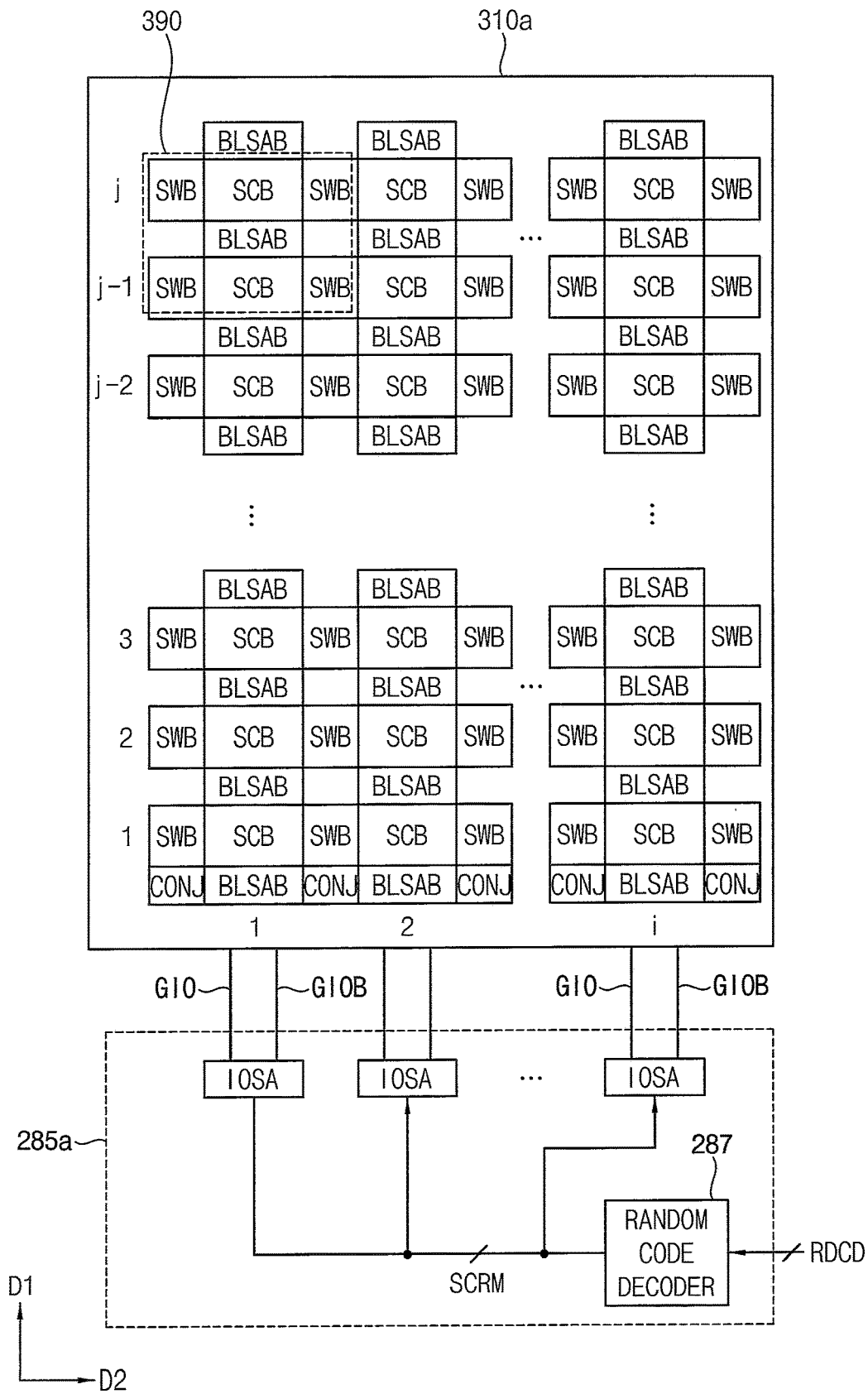
FIG. 7 is a diagram of the first bank array and a first sense amplifier in the semiconductor memory device of FIG. 5 according to an example embodiment of the inventive concept.

FIG. 7 is a diagram of the first bank array 310a and the first sense amplifier 285a of the semiconductor memory device 200 of FIG. 5 according to an embodiment of the inventive concept.

Referring to FIG. 7, in the first bank array 310a, i sub-array blocks SCB may be arranged in the second direction D2, and j sub-array blocks SCB may be arranged in the first direction D1 perpendicular to the second direction D2. i and j may represent a number of the sub-array blocks SCB arranged in the second direction and the first direction, respectively, and may be natural numbers greater than two.

i sub-array blocks SCB arranged in the second direction D2 in one row may be referred to as a row block. A plurality of bit lines, a plurality of word lines and a plurality of memory cells connected to the bit lines and the word lines disposed in each of the sub-array blocks SCB.

i+1 sub word line driver regions SWB may be disposed between the sub-array blocks SCB on each side of each of the sub-array blocks SCB in the second direction D2. Sub word line drivers may be disposed in the Rib word line driver regions SWB. j+1 bit line sense amplifier regions BLSAB may be disposed, for example, between above and below each of the sub-array blocks SCB in the first direction D1. Bit line sense amplifiers may sense data stored in the memory cells and may be disposed in the bit line sense amplifier regions BLSAB.

Each of a plurality of sub data units may be stored in each of the sub-array blocks SCB disposed in the second direction D2.

A plurality of sub word line drivers may be provided in each of the sub word line driver regions SWB. One sub word line driver region SWB may be associated with two sub-array blocks SCB adjacent to the sub word line driver region SWB in the second direction D2.

A plurality of conjunction regions CONJ may be disposed adjacent to the sub word line driver regions SWB and the bit line sense amplifier regions BLSAB. A voltage generator may be disposed in each of the conjunction regions CONJ.

The first sense amplifier 285a may be disposed in the first direction D1 with respect to the first bank array 310a, and the first sense amplifier 285a may include i I/O sense amplifiers IOSA and a random code decoder 287. The i I/O sense amplifiers IOSA may correspond to i sub-array blocks SCB disposed in the second direction D2. Each of the i I/O sense amplifiers IOSA may be connected to sub array blocks in the first direction D1 through a global line pair GIO and GIOB.

The random code decoder 287 may designate I/O sense amplifiers IOSA to perform the data scramble operation by generating a scramble signal SCRM in response to decoding the random code RDCD and providing the scramble signal SOW to the i I/O sense amplifiers IOSA. The scramble signal SCRM may include bits corresponding to the i I/O sense amplifiers IOSA, and each of the i I/O sense amplifiers IOSA may selectively perform the data scramble operation based on a logic level of a corresponding bit of the scramble signal SCRM.

A portion 390 in the first bank array 310a will be described with reference to FIG. 8 below.

Figure 8:
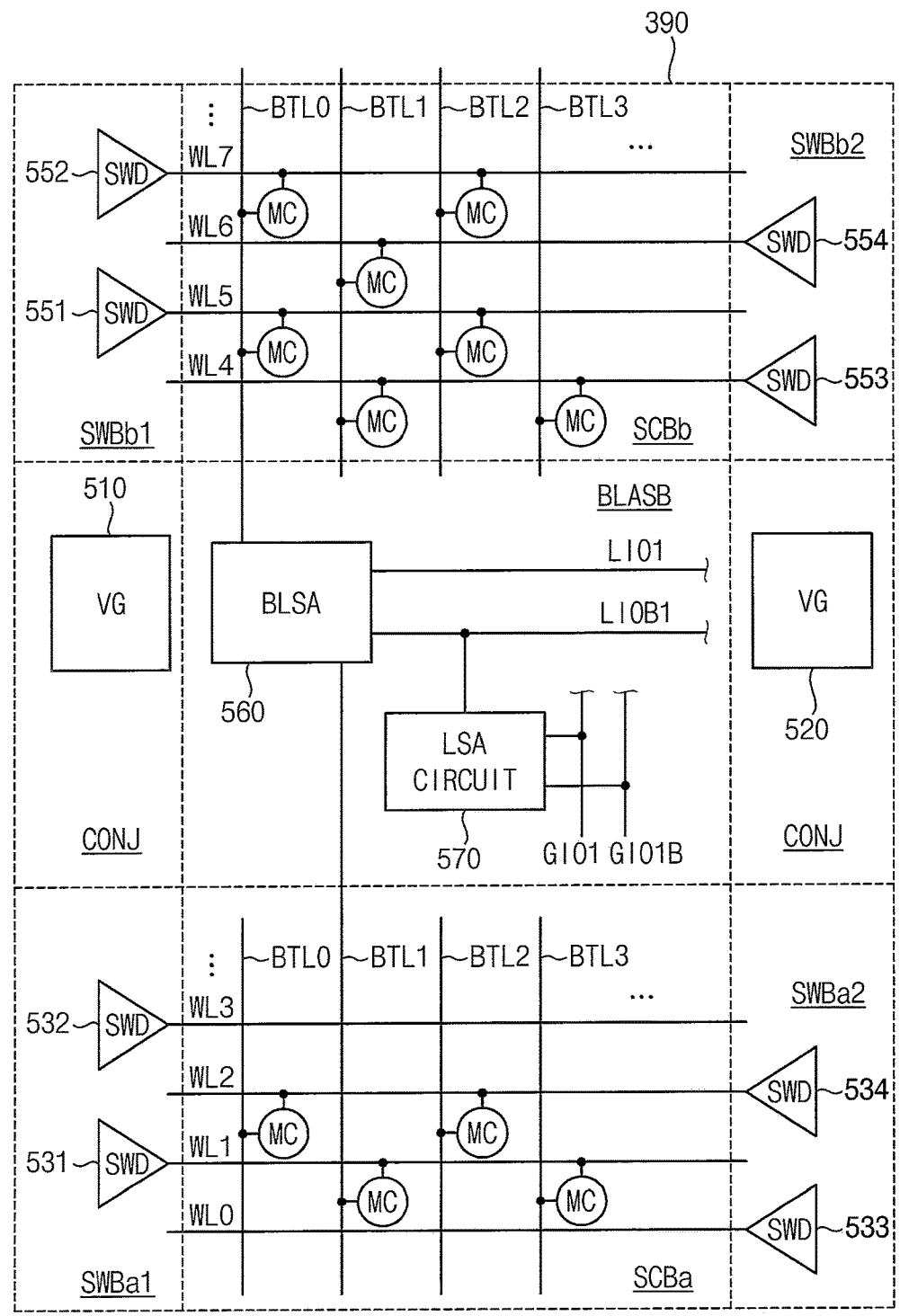
FIG. 8 is an enlarged view of the first bank array of FIG. 7 according to an embodiment of the inventive concept.

FIG. 8 is an enlarged view of the portion 390 of the first bank array 310a of FIG. 7 according to an embodiment of the inventive concept.

Referring to FIGS. 7 and 8, sub-array blocks SCBa and SCBb, the bit line sense amplifier regions BLSAB, four sub word line driver regions SWBa1, SWBa2, SWBb1, and SWBb2, and two of the conjunction regions CONS may be disposed in the portion 390 of the first bank array 310a.

The sub-array block SCBa may include a plurality of word lines WL0 to WL3 extending in a row direction (the second direction D2) and a plurality of bit lines BTL0 to BTL3 extending in the first direction D1. The sub-array block SCBa may include a plurality of memory cells MC which may be disposed at intersections of the word lines WL0 to WL3 and the bit lines BTL0 to BTL3. The sub-array block SCBb may include a plurality of word lines WL4 to WL7 extending in the second direction D2 and the plurality of bit line BTL0 to BTL3. The sub-array block SCBb may include a plurality of memory cells MC which may be disposed at intersections of the word lines WL4 to WL7 and the bit line BTL0 to BTL3.

With reference to FIG. 8, the sub word line driver regions SWBa1 and SWBa2 may include a first plurality of sub word line drivers 531, 532, 533, and 534 that may respectively drive the word lines WL0 to WL3. The sub word line driver regions SWBb1 and SWBb2 may include a second plurality of sub word line drivers 551, 552, 553, and 554 that may respectively drive the word lines WL4 to WL7.

The bit line sense amplifier regions BLSAB may include hit line sense amplifiers 560 coupled to the bit line BTL0 in the sub array block SCBb and the bit line BTL1 in the sub array block SCBa, and a local sense amplifier circuit 570. The bit line sense amplifier 560 may sense and amplify a voltage difference between the bit lines BTL0 and BTL1 to provide the amplified voltage difference to a local I/O line pair LIO1 and LIOB1.

The local sense amplifier circuit 570 may provide electrical connections between the local I/O line pair LIO1 and LIOB1 and a global I/O line pair GIO1 and GIOB1.

As illustrated in FIG. 8, the conjunction regions CONJ are disposed adjacent to the bit line sense amplifier regions BLSAB and the sub word line driver regions SWBa1, SWBb1, SWBa2, and SWBb2. The conjunction regions CONJ are also disposed at each corner of the sub-array block SCB in FIG. 8. First and second voltage generators 510 and 520 may be disposed in the conjunction regions CONJ.

Figure 9:
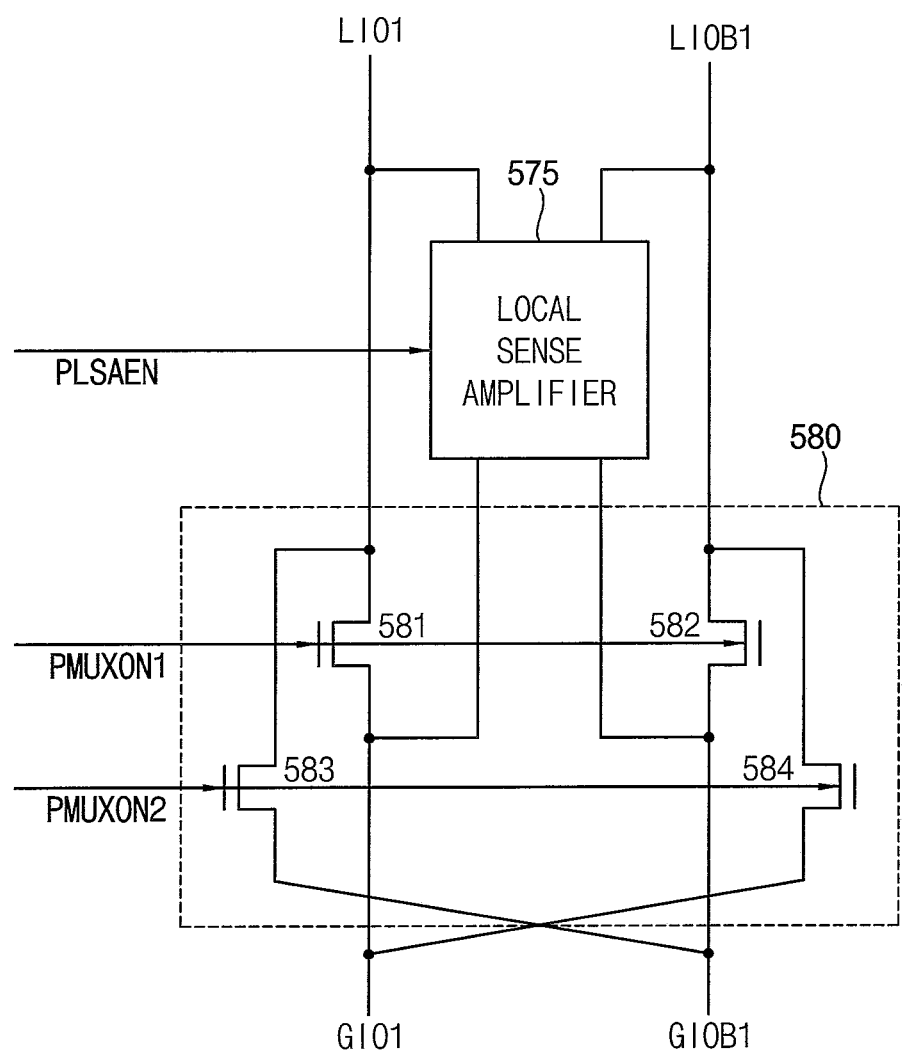
FIG. 9 is a diagram of a local sense amplifier circuit of FIG. 8 according to an embodiment of the inventive concept.

FIG. 9 is a diagram of the local sense amplifier circuit 570 of FIG. 8 according to an embodiment of the inventive concept.

Referring to FIG. 9, the local sense amplifier circuit 570 may include a local sense amplifier 575 and a local I/O line controller 580.

The local sense amplifier 575 may amplify a voltage difference between the local I/O line pair LIO1 and LIOB1 in response to a local sense enable signal PLSAEN and may provide the amplified voltage difference to a global I/O line pair GIO1 and GIOB1. The local. I/O line controller 580 may include first through fourth NMOS transistors 581, 582, 583, and 584, and may provide connections between the local I/O line pair LIO1 and LIOB1 and the global I/O line pair GIO1 and GIOB1 in response to a first connection control signal PMUXON1 and a second connection control signal PMUXON2.

For example, when each of the local sense enable signal PLSAEN, the first connection control signal PMUXON1, and the second connection control signal PMUXON2 is a low level, the local sense amplifier 575 may be deactivated and the local I/O line controller 580 may cut off a connection between the local I/O line pair LIO1 and LIOB1 and the global I/O line pair GIO1 and GIOB1.

For example, when each of the first local sense enable signal PLSAEN, the first connection control signal PMUXON1, and the second connection control signal. PMUXON2 is a high level, the local sense amplifier 575 may be activated and the local I/O line controller 580 may provide a connection between the local I/O line pair LIO1 and LIOB1 and the global I/O line pair GIO1 and GIOB1.

Figure 10:
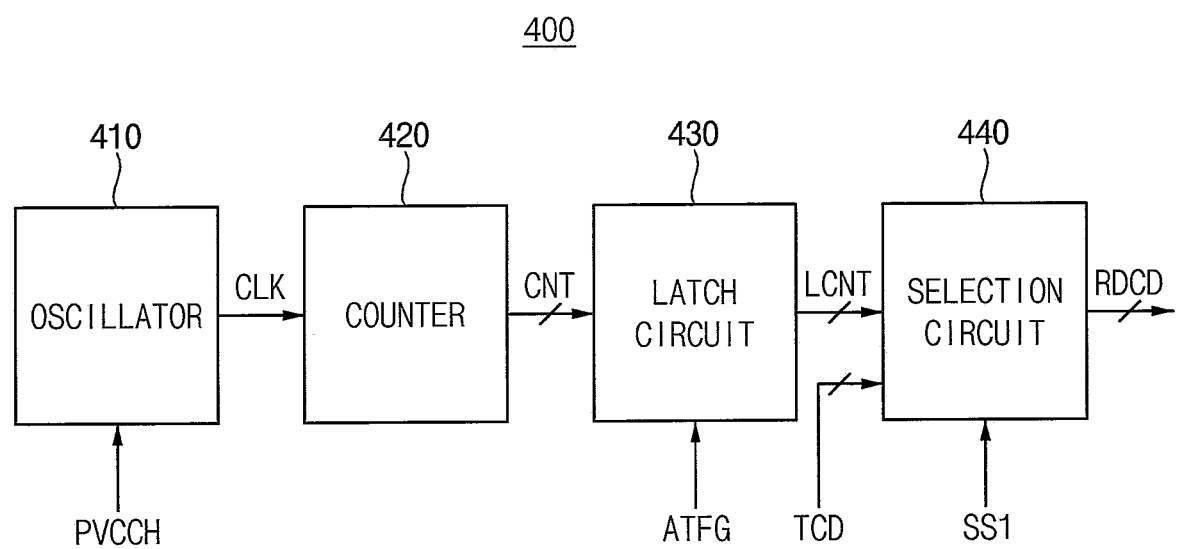
FIG. 10 is a block diagram of a random code generator of FIG. 5 according to an embodiment of the inventive concept.

FIG. 10 is a block diagram of the random code generator 400 of FIG. 5 according to an embodiment of the inventive concept.

Referring to FIG. 10, the random code generator 400 may include an oscillator 410, a counter 420, a latch circuit 430, and a selection circuit 440.

During an initial interval of the power-up sequence, the oscillator 410 may generate a clock signal CLK in response to the power stabilizing signal PVCCH. The counter 420 may generate a counting signal CNT including a plurality of counting bits by counting oscillations of the clock signal CLK.

The latch circuit 430 may latch the counting signal CNT based on the anti-fuse flag signal ATFG and may provide a latched counting signal LCNT.

The selection circuit 440 may select one of the latched counting signal LCNT and the test code TCD in response to a selection signal SS1 and may output the selected latched counting signal LCNT or test code TCD as the random code RDCD.

A frequency of the clock signal CLK may be very short, and the anti-fuse flag signal ATFG may transition from a high level to a low level in a time domain associated with a frequency which may be much greater than a time domain associated with the frequency of the clock signal CLK.

Therefore, a logic level of the counting bits of the counting signal CNT latched in response to anti-fuse flag signal ATFG transitioning to a low level may vary depending on a manufacturing process of the semiconductor memory device 200, applied voltage and operating temperature. For example, the random code RDCD may have randomness based on at least one of a difference between a manufacturing process associated with the oscillator and the anti-fuse circuit, a difference between a voltage applied to the oscillator and to the anti-fuse circuit, and a difference between a temperature of the oscillator and of the anti-fuse circuit, and the randomness may not be identified outside of the semiconductor memory device 200. Accordingly, randomness of the random code may be increased.

Figure 11:
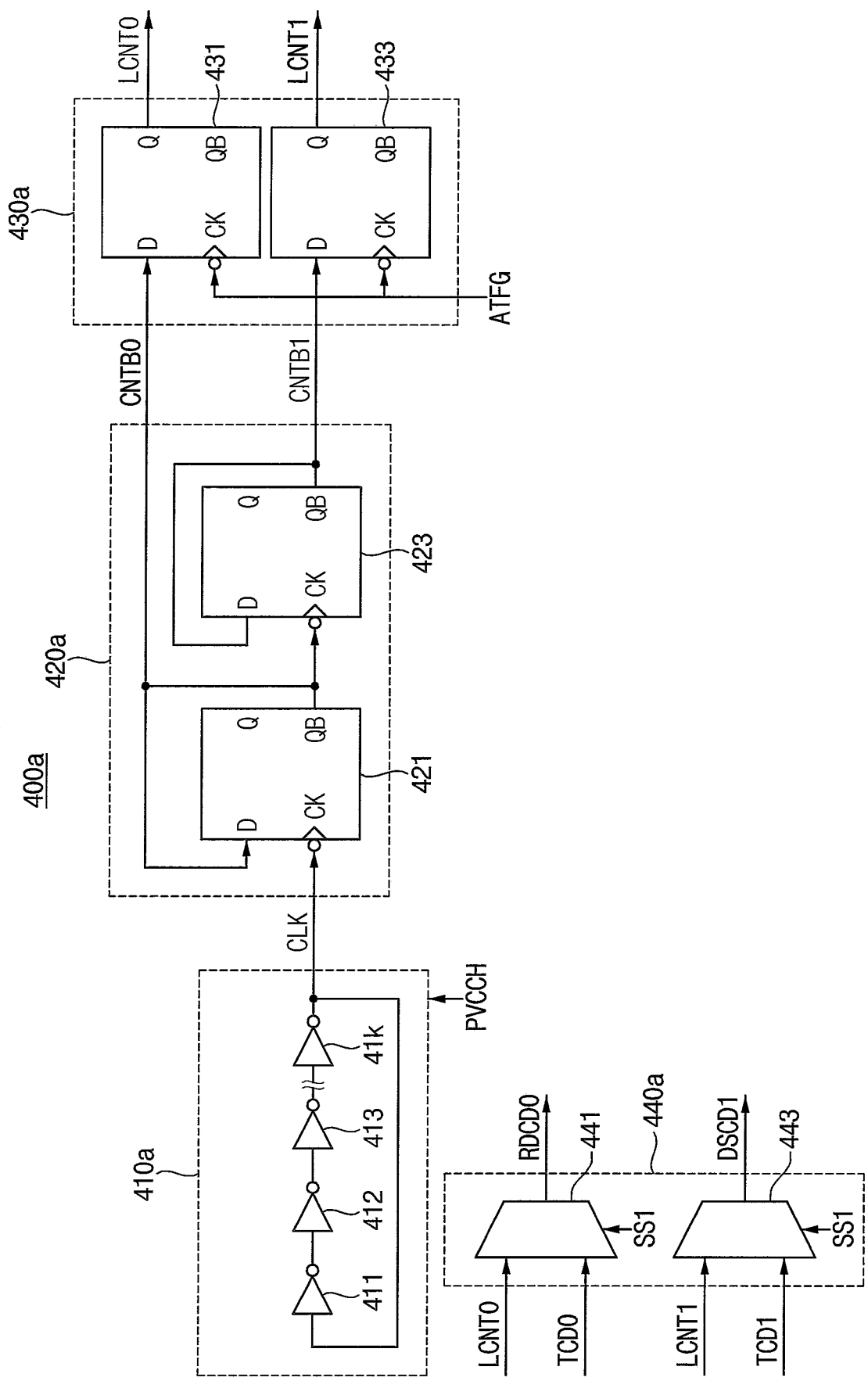
FIG. 11 is a circuit diagram of a random code generator according to an embodiment of the inventive concept.

FIG. 11 is a circuit diagram of a random code generator 400a according to an embodiment of the inventive concept.

Referring to FIG. 11, a random code generator 400a may include an oscillator 410a, a counter 420a, a latch circuit 430a, and a selection circuit 440a.

During the power-up sequence, the oscillator 410a may generate a clock signal CLK in response to the power stabilizing signal PVCCH. The oscillator 410a may be implemented as a ring oscillator including a plurality of inverters 411 to 41k, where k may be an integer equal to or greater than three.

The counter 420a may generate a counting signal CNT, including a first counting bit CNTB0 and a second counting bit cNTB1, by counting oscillations of the clock signal CLK. The counter 420a may include a first flip-flop 421 and a second flip-flop 423. Each of the first flip-flop 421 and the second flip-flop 423 may include a first D flip-flop having a first clock terminal CK, a first input terminal D, a first output terminal Q, and a first inverted output terminal QB.

The first flip-flop 421 may output the first counting bit CNTB0 by latching the first counting bit CNTB0 based on a falling edge of the clock signal CLK, with the first clock terminal CK receiving the clock signal CLK and the first input terminal D being coupled to the first inverted output terminal QB. The second flip-flop 423 may output the second counting bit CNTB1 by latching the second counting bit CNTB0 based on a falling edge of the first counting bit CNTB0, with the first clock terminal CK receiving the first counting bit CNTB0 and the first input terminal D being coupled to the first inverted output terminal QB.

The latch circuit. 430a may include a third flip-flop 431 and a fourth flip-flop 433. Each of the first third flip-flop 431 and the fourth flip-flop 433 may include a second D flip-flop having a second clock terminal CK, a second input terminal D, a second output terminal Q, and a second inverted output terminal QB.

The third flip-flop 431 may output a first latched counting bit LCNTB0 by latching the first counting bit CNTB0 based on a first falling edge of the anti-fuse flag signal ATFG, with the second clock terminal CK receiving the anti-fuse flag signal ATM and the second input terminal D receiving the first counting bit CNTB0. The fourth flip-flop 433 may output a second latched counting bit LCNTB1 by latching the second counting bit CNTB0 based on a second falling edge of the anti-fuse flag signal ATM, with the second clock terminal CK receiving the anti-fuse flag signal ATFG and the second input terminal D receiving the second counting bit CNTB0.

The selection circuit 440a may include a first multiplexer 441 and a second multiplexer 443.

The first multiplexer 441 may output one of the first latched counting bit LCNTB0 and a first test code bit TCD0 as a first random bit RDCD0 in response to the selection signal SS1 and the second multiplexer 443 may output one of the second latched counting hit LCNTB1 and a first test code bit TCD1 as a second random bit RDCD1 in response to the selection signal SS1.

A designer, a user, and/or an external device may check whether the random code generator 400a operates normally in a test mode by applying the first test code bit TCD0 and the second test code bit TCD1 to the random code generator 400a.

Figure 12:
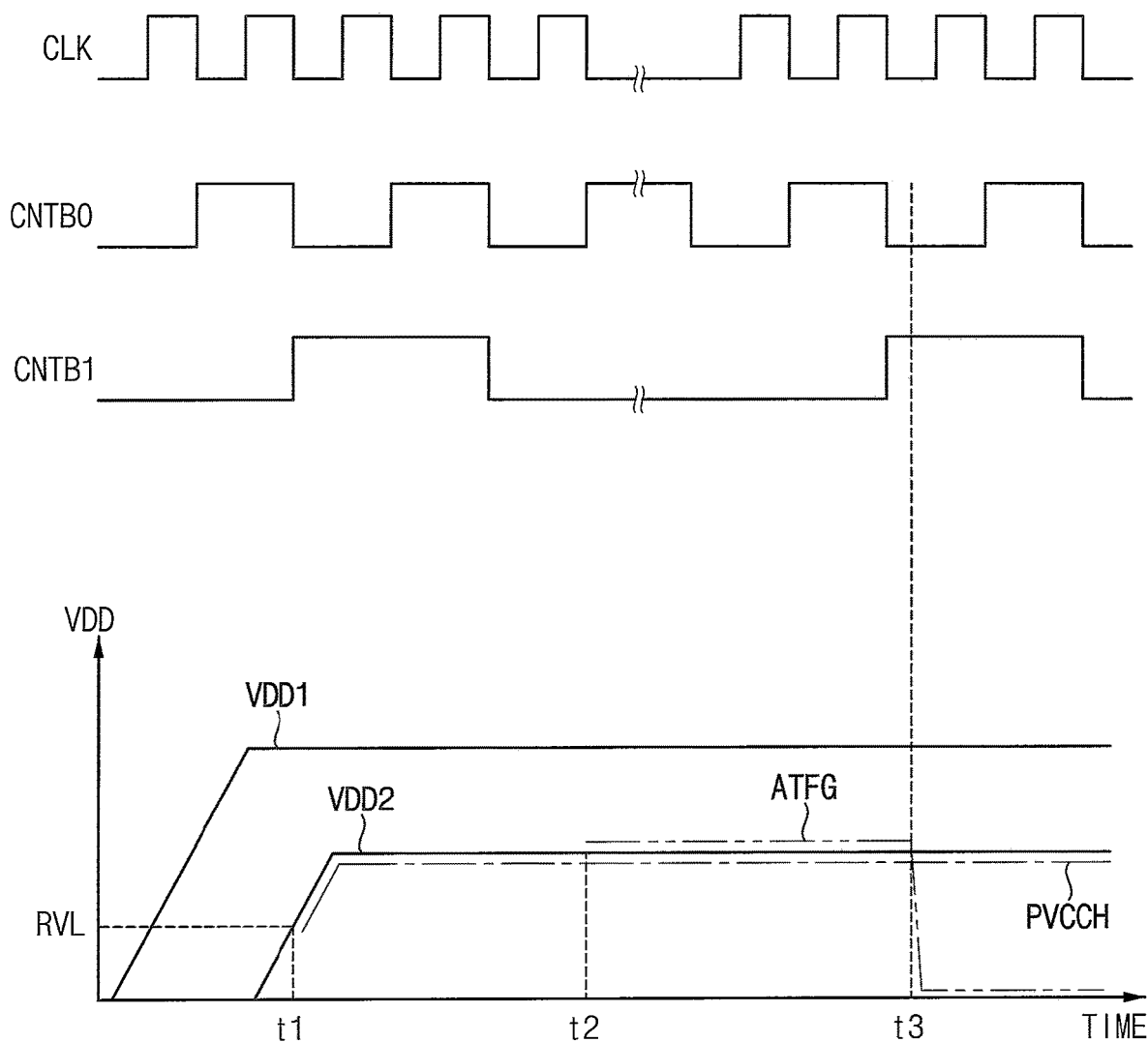
FIG. 12 is a timing diagram illustrating an operation of the random code generator of FIG. 11 according to an embodiment of the inventive concept.

FIG. 12 is a timing diagram illustrating an operation of the random code generator 400a of FIG. 11 according to an embodiment of the inventive concept.

Referring to FIGS. 5, 11, and 12, an external voltage VDD may be applied to the voltage generator 490 during a power-up sequence of the semiconductor memory device 200, and the voltage generator 490 may generate operating voltages VDD1 and VDD2 based on the external voltage VDD. The voltage generator 490 may transition the power stabilizing signal PVCCH to a high level in response to the operating voltage VDD2 reaching a reference voltage level RVL at a time point t1.

The oscillator 410a may begin to oscillate in response to the power stabilizing signal PVCCH transitioning to the high level and may output the clock signal CLK.

The counter 420a may generate and output the counting signal CNT including the first counting bit CNTB0 and the second counting bit CNTB1, by counting oscillations of the clock signal CLK. At a time point t2, information associated with an anti-fuse circuit of the semiconductor memory device 200 may begin to be transferred to the anti-fuse circuit, and the anti-fuse flag signal ATFG may transition to a high level. At a time point t3, the transferring of the information associated with the anti-fuse circuits to the anti-fuse circuits may be completed, and the anti-fuse flag signal ATFG may transition to a low level.

The latch circuit 430 may latch the first counting bit CNTB0 and the second counting bit CNTB1 in response to the anti-fuse flag signal ATFG transitioning to a low level and may provide the latched counting signal LCNT in response. Therefore, the first counting bit CNTB0 and the second counting bit CNTB1 may be provided at the time point t3 as the first random bit RDCD0 and the second random bit RDCD1, respectively.

Figure 13:
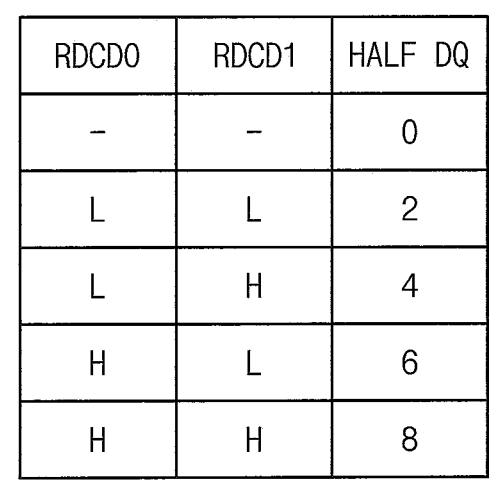

FIG. 13 is a table illustrating a number of I/O sense amplifiers IOSA included in the second group of I/O sense amplifiers, HALF DQ, which may be selected to perform data scrambling. The second group of I/O sense amplifiers of FIG. 13 may perform data scrambling in response to receiving the scramble signal SCRM, and each I/O sense amplifier included in the second group may be selected from the first group of I/O sense amplifiers based on the first random bit RDCD0 and the second random bit RDCD1.

Referring to FIG. 13, when the I/O sense amplifiers of the sense amplifier 285a do not receive the scramble signal SCRM, logic levels of the first random bit RDCD0 and the second random bit RDCD1 are not determined, and no I/O sense amplifiers may be selected for the second group.

When the I/O sense amplifiers of the sense amplifier 285a receive the scramble signal SCRM and logic levels of the first random bit RDCD0 and the second random bit RDCD1 are low, two I/O sense amplifiers IOSA may be selected for the second group from among eight first I/O sense amplifiers IOSA and may perform the data scrambling.

When the I/O sense amplifiers of the sense amplifier 285a receive the scramble signal SCRM and logic levels of the first random bit RDCD0 and the second random bit RDCD1 are low and high, respectively, four I/O sense amplifiers IOSA may be selected for the second group from among the eight first I/O sense amplifiers IOSA and may perform data scrambling.

When the I/O sense amplifiers of the sense amplifier 285a receive the scramble signal SCRM and logic levels of the first random bit RDCD0 and the second random bit RDCD1 are high and low, respectively, six I/O sense amplifiers IOSA may be selected for the second group from among the eight first I/O sense amplifiers IOSA and may perform the data scrambling.

When the I/O sense amplifiers of the sense amplifier 285a receive the scramble signal SCRM and logic levels of the first random bit RDCD0 and the second random bit RDCD1 are high, eight I/O sense amplifiers IOSA may be selected for the second group from among the eight first I/O sense amplifiers IOSA and may perform the data scrambling.

The second group of I/O sense amplifiers IOSA may perform data scrambling based on logic levels of the first random bit RDCD0 and the second random bit RDCD1. The second sense I/O sense amplifiers IOSA may scramble data bits to be stored in a memory array and may store the scrambled data bits in the memory array. As a result, this may reduce noise which may occur when a greater number of data bits having a first logic level are stored in memory (and in a target page, to be described later) than data bits having a second logic level, FIG. 14 illustrates a portion of the semiconductor memory device 200 of FIG. 7 according to an embodiment of the inventive concept, FIG. 14 illustrates a portion of the first bank array 310a and a portion of the first sense amplifier 285a.

Figure 14:
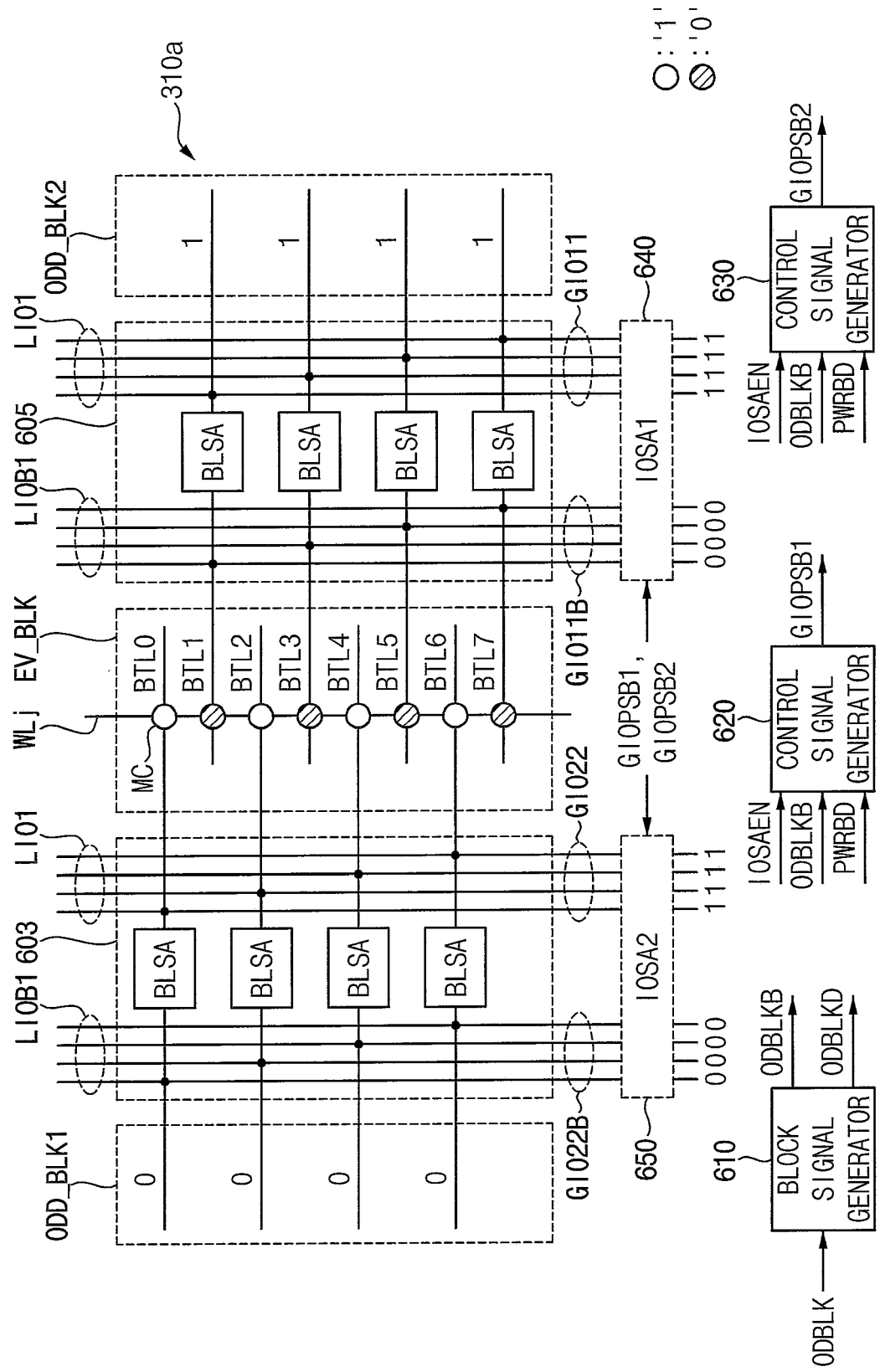
FIG. 14 illustrates a portion of the semiconductor memory device of FIG. 7 according to an embodiment of the inventive concept.

Referring to FIG. 14, the first bank array 310a may include sub array blocks ODD_BLK1, EV_BLK, and ODD_BLK2, and first and second bit line sense amplifier regions 603 and 605 disposed between the sub array blocks ODD_BLK1, EV_BLK, and ODD_BLK2. The first sense amplifier 285a may include a block signal generator 610, first and second control signal generators 620 and 630, a first I/O sense amplifier 640 corresponding to the second bit line sense amplifier region 605, and a second I/O sense amplifier 650 corresponding to the first bit line sense amplifier region 603.

First and second sub array blocks ODD_BLK1 and ODD_BLK2 may be odd sub array blocks, which may be identified by a first portion of bits of a column address, and the sub array block EV_BLK may be an even sub array block, which may be identified by a second portion of bits of the column address.

The even sub array block EV_BLK may include memory cells MC coupled to word line WLj and bit lines BTL0 to BTL7. The first bit line sense amplifier region 603 may include a plurality of bit line sense amplifiers BLSA coupled to even bit lines BTL0, BTL2, BTL4 and BTL6 in the even sub array block. EV_BLK and odd bit-lines in the first odd sub array block ODD_BLK1 with an open bit line configuration. The second bit line sense amplifier region 605 may include a plurality of bit line sense amplifiers BLSA coupled to odd bit lines BTL1, BTL3, BTL5 and BTL7 in the even sub array block EV_BLK and even bit lines in the second odd sub array block ODD_BLK2 with an open bit line configuration.

The bit line sense amplifiers BLSA in the first bit line sense amplifier region 603 may be coupled to first and second global I/O lines GIO22 and GIO22B through the local I/O line pair LIO1 and LIOB1, and the first and second global I/O lines GIO22 and GIO22B may be connected to the second I/O sense amplifier 650. The bit line sense amplifiers BLSA in the second bit line sense amplifier region 605 may be coupled to third and fourth global I/O lines GIO11 and GIO11B through the local I/O line pair LIO1 and LIOB1, and the third and fourth global lines GIO11 and GIO11B may be connected to the first I/O sense amplifier 640.

The first and second I/O sense amplifiers 640 and 650 may selectively scramble data bits of input and/or output data in response to first and second global pass signals GIOPSB1 and GIOPSB2, and may store the selectively scrambled data bits in the sub array blocks ODD_BLK1, EV_BLK, and ODD_BLK2.

The block signal generator 610 may generate first and second odd-block designating signals ODBLKB and ODBLKD based on an odd-block signal ODBLIK. The first control signal generator 620 may generate the first global pass signal GIOPSB1 based on a sense amplifier enable signal IOSAEN, the first odd-block designating signal ODBLKB, and a signal PWRBD. The second control signal generator 630 may generate the second global pass signal GIOPSB2 based on the sense amplifier enable signal IOSAEN, the second odd-block designating signal ODBLKD, and the signal PWRBD.

When a target sub array block corresponds to an even sub array block, the odd-block signal ODBLK and the second odd-block designating signal ODBLKD may have a low level, the first odd-block designating signal ODBLKB may have a high level, the first global pass signal GIOPSB1 may have a high level, and the second global pass signal GIOPSB2 may have a low level.

In FIG. 14, data having a high level ("1") is stored in the memory cells MC coupled to the even bit lines BTL0, BTL2, BTL4 and BTL6, and data having a low level ("0") is stored in the memory cells MC coupled to the odd bit lines BTL1, BTL3, BTL5 and BTL7.

Figure 15:
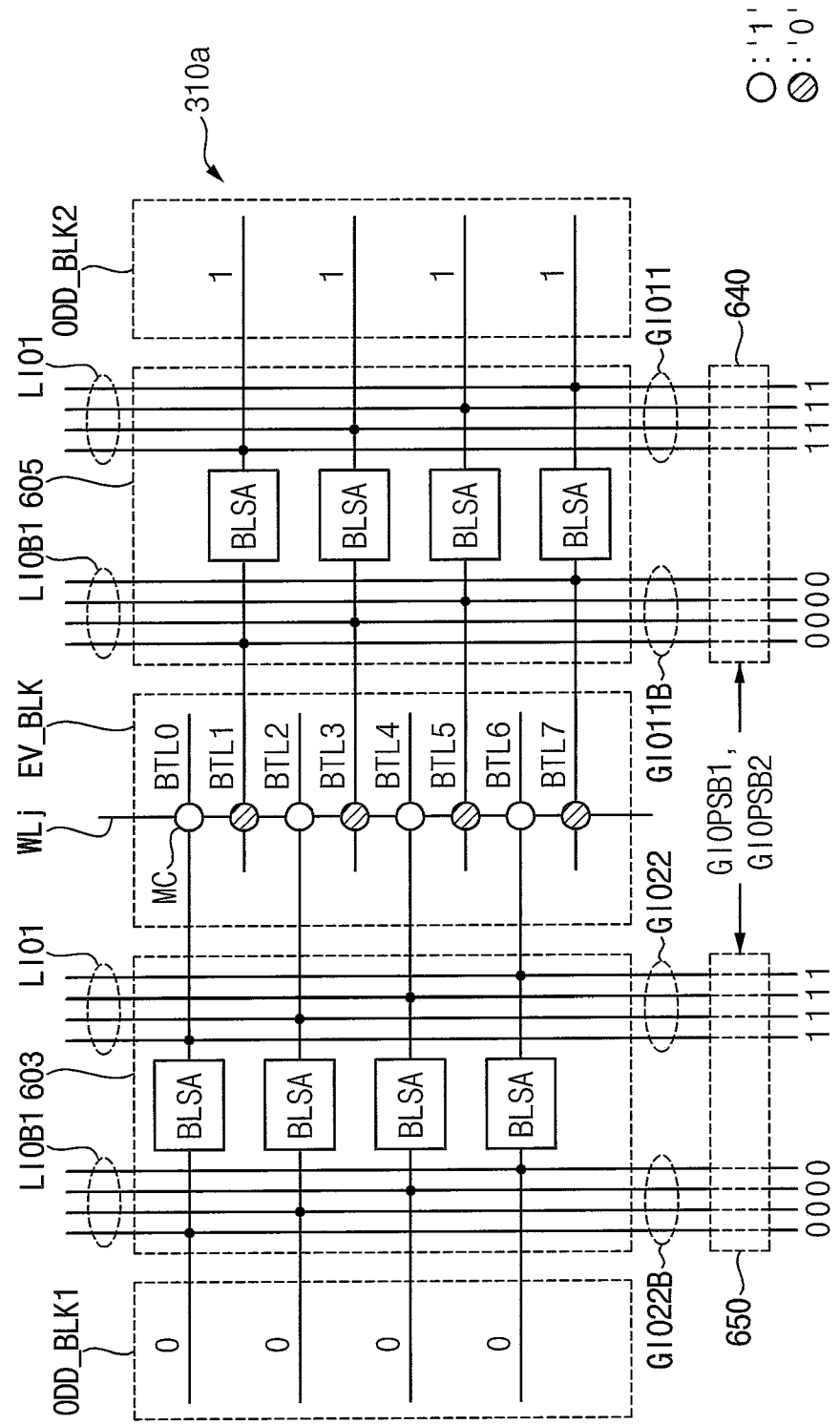
FIG. 15 illustrates operation of a first and second I/O sense amplifier of FIG. 14 according to an embodiment of the inventive concept.

FIG. 15 illustrates an operation of the first and second I/O sense amplifiers 640 and 650 of FIG. 14 according to an embodiment of the inventive concept.

Referring to FIG. 15, the first I/O sense amplifier 640 may invert and provide data bits of data to the memory cells MC coupled to the odd bit lines BTL1, BTL3, BTL5, and BTL7 included in the even sub array block EV_BLK based on the first global pass signal GIOPSB1 and the second global pass signal GIOPSB2, and the memory cells MC may store the inverted data bits. However, embodiments of the inventive concept are not limited thereto. For example, the first I/O sense amplifier 640 may provide the data bits without inverting the data bits.

The second I/O sense amplifier 650 may provide non-inverted data bits of data to the memory cells MC coupled to the even bit lines BTL0, BTL2, BTL4, and BTL6 included in the even sub array block EV_BLK based on the first global pass signal GIOPSB1 and the second global pass signal GIOPSB2, and the memory cells MC may store the non-inverted data bits. However, embodiments of the inventive concept are not limited thereto. For example, the second I/O sense amplifier 650 may invert the data bits before providing the data bits.

Figure 16:
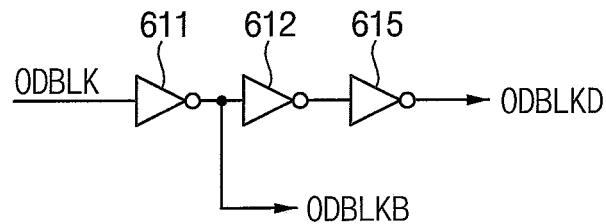
FIG. 16 is a diagram of the block signal generator of FIG. 14 according to an embodiment of the inventive concept.

FIG. 16 is a diagram of the block signal generator 610 of FIG. 14 according to an embodiment of the inventive concept.

Referring to FIG. 16, the block signal generator 610 may include first, second, and third inverters 611, 612, and 615. The first inverter 611 may output the first odd-block designating signal ODBLKB by inverting the odd-block signal ODBLK. The second inverter 612 may produce an output by inverting the first odd-block designating signal ODBLKB, and the third inverter 615 may output the second odd block designating signal ODBLKD by inverting the output of the second inverter 612.

Figure 17:
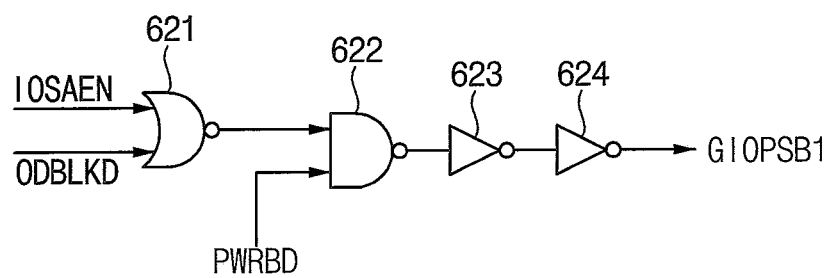
FIG. 17 is a diagram of a first control signal generator of FIG. 14 according to an embodiment of the inventive concept.

FIG. 17 is a diagram of the first control signal generator 620 of FIG. 14 according to an embodiment of the inventive concept.

Referring to FIG. 17, the first control signal generator 620 may include a first NOR gate 621, a first NAND gate 622, and fourth and fifth inverters 623 and 624.

The first NOR gate 621 may perform a NOR operation on the sense amplifier enable signal IOSAEN and the second odd-block designating signal ODBLKD. The first NAND gate 622 may perform a NAND operation on an output of the first NOR gate 621 and the signal. PWRBD. The fourth inverter 623 may invert an output of the first NAND gate 622, and the fifth inverter 624 may output the first global pass signal GIOPSB1 by inverting the output of the fourth inverter 623.

Figure 18:
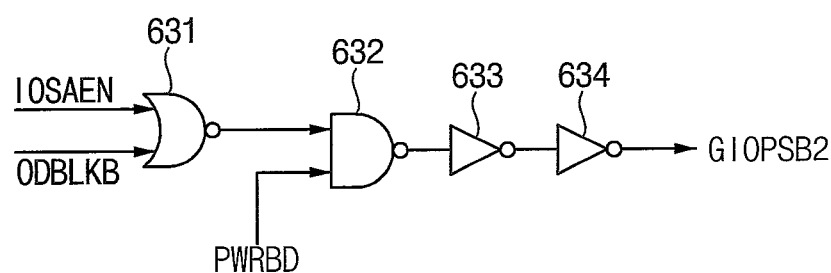
FIG. 18 is a diagram of a second control signal generator of FIG. 14 according to an embodiment of the inventive concept.

FIG. 18 is a diagram of the second control signal generator 630 of FIG. 14 according to an embodiment of the inventive concept.

Referring to FIG. 18, the second control signal generator 630 may include a second NOR gate 631, a second NAND gate 632, and sixth and seventh inverters 633 and 634.

The second NOR gate 631 may perform a NOR operation on the sense amplifier enable signal IOSAEN and the first odd-block designating signal ODBLKB. The second NAND gate 632 may perform a NAND operation on an output of the second NOR gate 631 and the signal PWRBD. The sixth inverter 633 may invert an output of the second NAND gate 632, and the seventh inverter 634 may output the second global pass signal GIOPSB2 by inverting an output of the sixth inverter 633.

Figure 19:
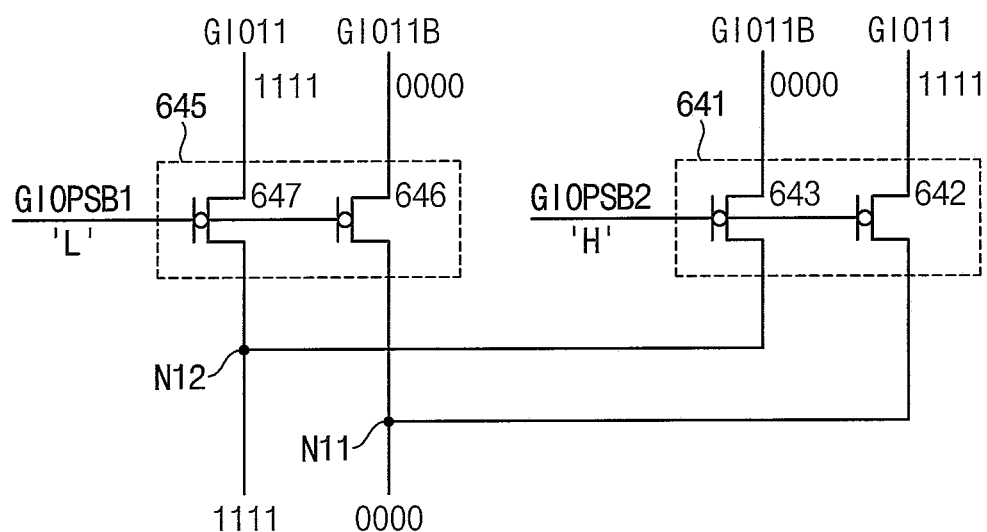
FIG. 19 is a diagram of the first I/O sense amplifier of FIG. 14.

FIG. 19 is a diagram of the first I/O sense amplifier 640 of FIG. 14.

Referring to FIG. 19, the first I/O sense amplifier 640 may include a first selective inverter 641 and a second selective inverter 645.

The first selective inverter 641 may include first and second PMOS transistors 642 and 643. The first PMOS transistor 642 may have a source coupled to the third global I/O line GIO11, a gate receiving the second global pass signal GIOPSB2, and a drain coupled to a first node N11. The second. PMOS transistor 643 may have a source coupled to the fourth global I/O line GIO11B, a gate receiving the second global pass signal GIOPSB2, and a drain coupled to a second node N12.

The second selective inverter 645 may include third and fourth PMOS transistors 646 and 647. The third PMOS transistor 646 may have a source coupled to the fourth global I/O line GIO11B, a gate receiving the first global pass signal GIOPSB1, and a drain coupled to the first node N11. The fourth PMOS transistor 647 may have a source coupled to the third global I/O line GIO11, a gate receiving the first global pass signal GIOPSB1, and a drain coupled to the second node N12.

The first and second PMOS transistors 642 and 643 may be turned on or off based on a logic level of the second global pass signal GIOPSB2, the third and fourth PMOS transistors 646 and 647 may be turned on or off based on a logic level of the first global pass signal GIOPSB1, data bits provided to the third and fourth global I/O lines GIO11 and GIO11B may be selectively inverted by the first and second selective inverters 641 and 645, and the data bits may be provided to the first node N11 and the second node N12, respectively.

In FIG. 19, it is illustrated that the first global pass signal GIOPSB1 has a low level and the second global pass signal GIOPSB2, the third and fourth PMOS transistors 646 and 647 are turned on based on the first global pass signal GIOPSB1, and data bits '0000' on the fourth global I/O line GIO11B and data bits '1111' on the third global I/O line GIO11 are provided to the first node N11 and the second node N12, respectively. However, embodiments of the inventive concept are not limited thereto. For example, when the first global pass signal GIOPSB1 has a high level and the second global pass signal GIOPSB2 has a low level, the first and second PMOS transistors 642 and 643 may be turned on based on the second global pass signal GIOPSB2, and data bits '1111' on the fourth global I/O line GIO11B and data bits '0000' on the third global I/O line GIO11 may be provided to the first node N11 and the second node N12, respectively.

Figure 20:
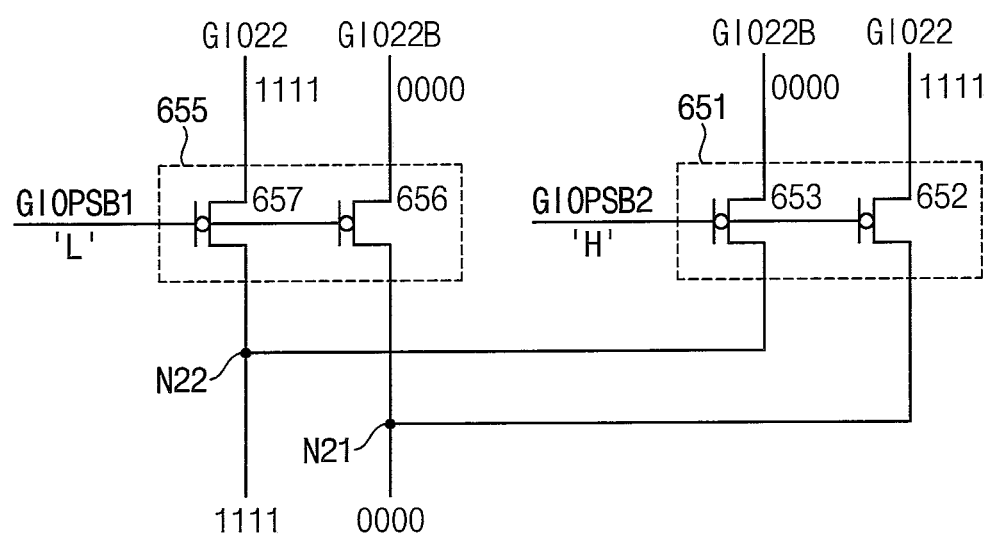
FIG. 20 is a diagram of the second I/O sense amplifier of FIG. 14.

FIG. 20 is a diagram of the second. I/O sense amplifier 650 of FIG. 14.

Referring to FIG. 20, the second I/O sense amplifier 650 may include a third selective inverter 651 and a fourth selective inverter 655.

The third selective inverter 651 may include fifth and sixth PMOS transistors 652 and 653. The fifth PMOS transistor 652 may have a source coupled to the first global I/O line GIO22, a gate receiving the second global pass signal GIOPSB2, and a drain coupled to a third node N21. The sixth PMOS transistor 653 may have a source coupled to the second global I/O line GIO22B, a gate receiving the second global pass signal GIOPSB2, and a drain coupled to a fourth node N22.

The fourth selective inverter 655 may include seventh and eighth PMOS transistors 656 and 657. The seventh PMOS transistor 656 may have a source coupled to the second global I/O line GIO22B, a gate receiving the first global pass signal GIOPSB1, and a drain coupled to the third node N21. The eighth PMOS transistor 657 may have a source coupled to the first global I/O line GIO22, a gate receiving the first global pass signal GIOPSB1, and a drain coupled to the fourth node N22.

The fifth and sixth PMOS transistors 652 and 653 may be turned on or off based on a logic level of the second global pass signal GIOPSB2, the seventh and eighth PMOS transistors 656 and 657 may be turned on or off based on a logic level of the first global pass signal GIOPSB1, data bits provided to the global I/O lines GIO22 and GIO22B may be selectively inverted by the selective inverters 651 and 656, and the data bits may be provided to the third node N21 and the fourth node N22.

In FIG. 20, it is illustrated that the first global pass signal GIOPSB1 has a low level and the second global pass signal G-IOPSB2, the seventh and eighth PMOS transistors 656 and 657 are turned on based on the first global pass signal GIOPSB1, and data bits '0000' on the second global I/O line GIO22B and data bits '1111' on the first global I/O line GIO22 are provided to the third node N21 and the fourth node N22, respectively. However, embodiments of the inventive concept are not limited thereto. For example, when the first global pass signal GIOPSB1 has a high level and the second global pass signal GIOPSB2 has a low level, the fifth and sixth PMOS transistors 652 and 653 may be turned on based on the second global pass signal GIOPSB2 and data bits '1111' on the second global I/O line GIO22B and data bits '0000' on the first global I/O line GIO22 may be provided to the first node N21 and the second node N22, respectively.

Although the first I/O sense amplifier 640 and the second I/O sense amplifier 650 are illustrated as including PMOS transistors in FIGS. 19 and 20, embodiments of the inventive concept are not limited thereto. For example, the first I/O sense amplifier 640 may include a first plurality of inverters coupled to each of the third and fourth global I/O lines GIO11 and GIO11B, and the first plurality of inverters may selectively invert data bits provided through the third and fourth global I/O lines GIO11 and GIO11B based on the first global pass signal GIOPSB1 and the second global pass signal GIOPSB2.

In addition, the second I/O sense amplifier 650 may include a second plurality of inverters coupled to each of the first and second global I/O lines 61022 and GIO22B, and the second plurality of inverters may selectively invert data bits provided through the first and second global I/O lines GIO22 and GIO22B based on the first global pass signal GIOPSB1 and the second global pass signal GIOPSB2.

Figure 21:
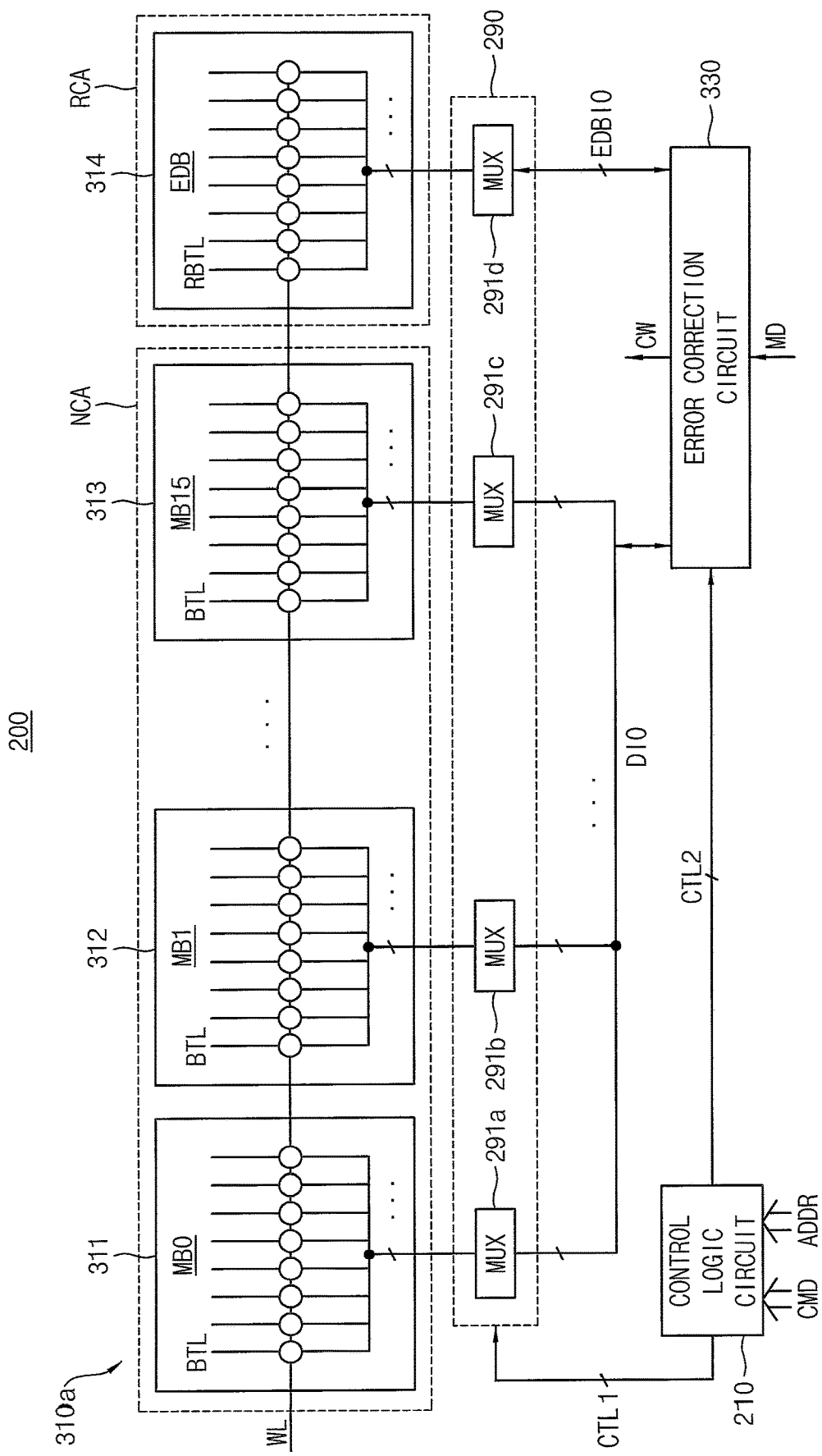
FIG. 21 illustrates a portion of the semiconductor memory device of FIG. 5 during a write operation according to an embodiment of the inventive concept.

FIG. 21 illustrates a portion of the semiconductor memory device 200 of FIG. 5 during a write operation according to an embodiment of the inventive concept.

In FIG. 21, the control logic circuit 210, the first bank array 310a, the I/O gating circuit 290, and the error correction circuit 330 of the semiconductor memory device 200 are illustrated.

Referring to FIG. 21, the first bank array 310a may include a normal cell array NCA and a redundancy cell array RCA.

The normal cell array NCA may include a plurality of first memory blocks MB0 to MB15 (i.e., 311 to 313), and the redundancy cell array RCA may include at least a second memory block 314. The first memory blocks 311 to 313 may be memory blocks which may determine a memory capacity of the semiconductor memory device 200. The second memory block 314 may be used in an ECC and/or redundancy repair process. Since the second memory block 314 may be used in an ECC, data line repair or block repair process to repair one or more failed cells which may be generated in the first memory blocks 311 to 313, the second memory block 314 may also be referred to as an execute disable bit (EDB) block. The first memory blocks 311 to 313 and the second memory block 314 may each be representative of a sub array block SCC in FIG. 7.

The I/O gating circuit 290 may include a plurality of switching circuits 291a to 291d respectively connected to the first memory blocks 311 to 313 and the second memory block 314.

The error correction circuit 330 may be connected to the switching circuits 291a to 291d through first data lines DIO and second data lines EDBIO. The control logic circuit 210 may receive the command CMD and the address ADDR and may generate the first control signal CTL1 for controlling the switching circuits 291a to 291d and the second control signal CTL2 for controlling the error correction circuit 330 by decoding the command CMD.

When the command CMD is a write command, the control logic circuit 210 may provide the second control signal CTL2 to the error correction circuit 330. The error correction circuit 330 may generate parity data associated with the main data MD by ECC encoding the main data MD and may provide the I/O gating circuit 290 with the codeword CW including the main data MD and the parity data. The control logic circuit 210 may provide the first control signal CTL1 to the I/O gating circuit 290 such that the codeword CW may be stored in a sub-page of a target page in the first bank array 310a.

Figure 22:
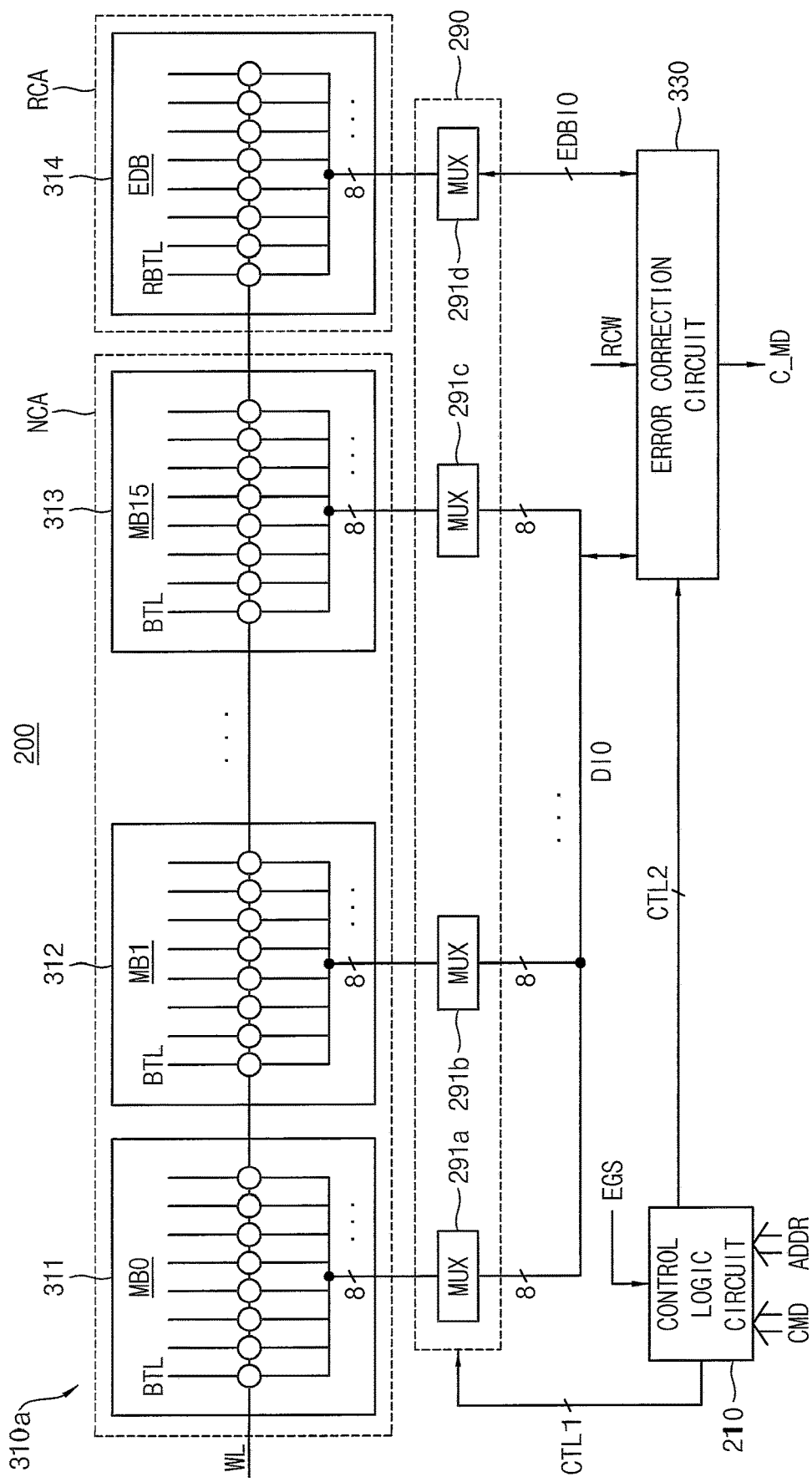
FIG. 22 illustrates a portion of the semiconductor memory device of FIG. 5 during a read operation according to an embodiment of the inventive concept.

FIG. 22 illustrates a portion of the semiconductor memory device 200 of FIG. 5 during a read operation according to an embodiment of the inventive concept.

Referring to FIG. 22, when the command CMD is a read command to designate a read operation, the control logic circuit 210 may provide the first control signal CTL1 to the I/O gating circuit 290 such that a read codeword RCW stored in a sub-page of a target page in the first bank array 310a may be provided to the error correction circuit 330.

The error correction circuit 330 may correct a single bit error or two bit errors in the read codeword RCW determined by the syndrome generator and a sub parity check matrix, including the parity data, by ECC decoding the read codeword RCW, and may output the corrected main data C_MD corresponding to the ECC decoded read codeword RCW.

Figure 23:
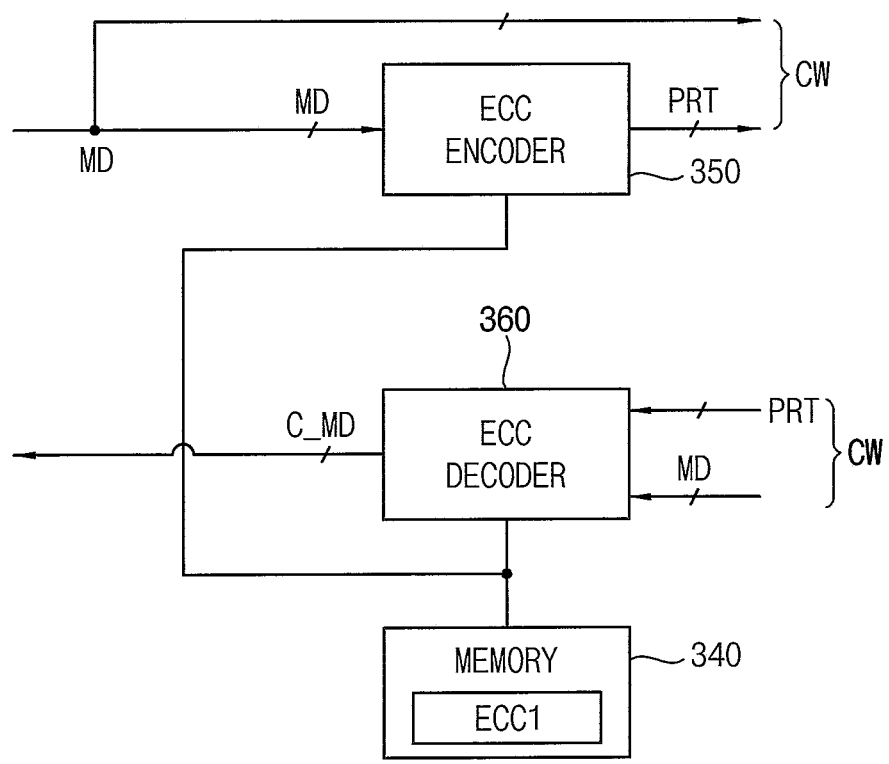
FIG. 23 is a block diagram of an error correction circuit in the semiconductor memory device of FIG. 5 according to an embodiment of the inventive concept.

FIG. 23 is a block diagram of an example of the error correction circuit 330 in the semiconductor memory device 200 of FIG. 5 according to an embodiment of the inventive concept.

Referring to FIG. 23, the error correction circuit 330 may include an ECC memory 340, an ECC encoder 350, and an ECC decoder 360.

The ECC memory 340 may store a first ECC ECC1. The first ECC ECC1 may be represented by a generation matrix. For example, a data format and/or structure of the first ECC ECC1 may be a generation matrix. The first ECC ECC1 may include a plurality of column vectors corresponding to data bits in the main data (e.g., MD) and the parity data.

The ECC encoder 350 may be connected to the ECC memory 340, and may generate the parity data PRT in a write operation of the semiconductor memory device 200 by ECC encoding the main data MD based on the first ECC ECC1 stored in the EEC memory 340. The ECC encoder 350 may provide the I/O gating circuit 290 with the codeword CW including the main data MD and the parity data PRT.

The ECC decoder 360 may be connected to the ECC memory 340, may receive the main data MD and the parity data PRT as the codeword CW, may correct and/or detect an error bit in the main data MD by ECC decoding the main data MD based on the parity data PRT using the first ECC ECC1, and may provide the corrected main data C_MD.

Although it is described with reference to FIG. 23 that the ECC memory 340 may be coupled to the ECC encoder 350 and the ECC decoder 360, embodiments of the inventive concept are not limited thereto. For example, the ECC memory 340 may be implemented with exclusive OR gates within the ECC encoder 350 and the EEC decoder 360.

Figure 24:
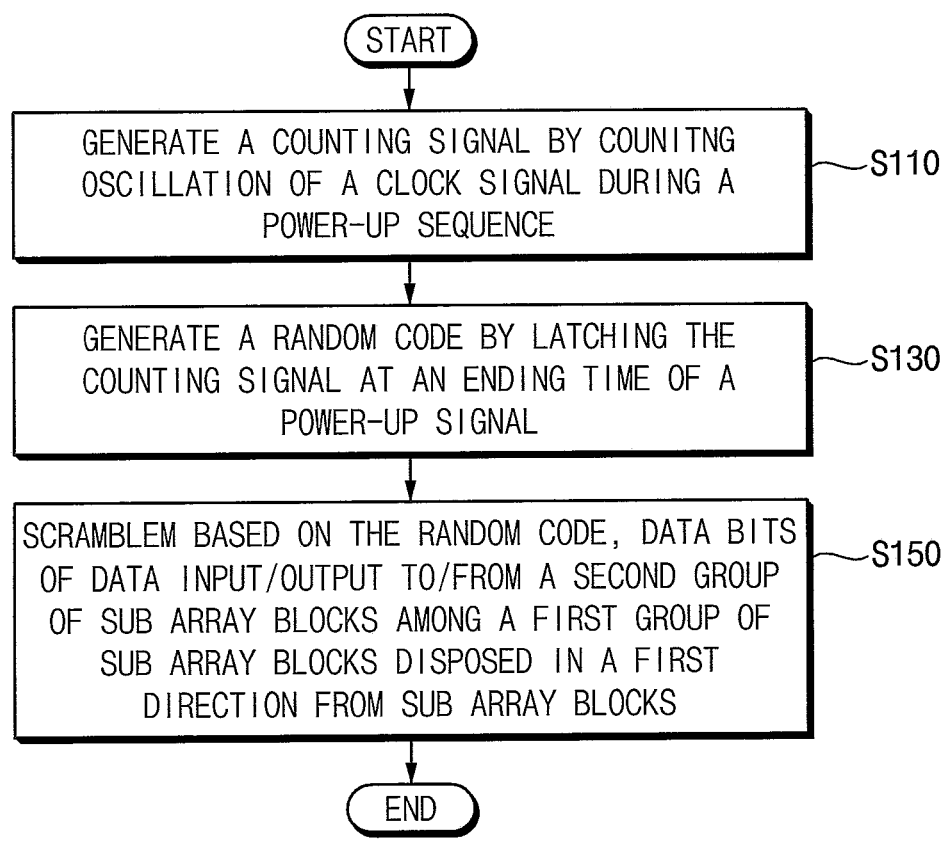
FIG. 24 is a flow chart illustrating a method of operating a semiconductor memory device according to an embodiment of the inventive concept.

FIG. 24 is a flow chart illustrating a method of operating a semiconductor memory device according to an embodiment of the inventive concept.

Referring to FIGS. 5 through 24, the semiconductor memory device 200 may include a memory cell array 300 including a plurality of volatile memory cells connected to word lines and hit lines, and the memory cell array 300 may be divided into a plurality of sub array blocks SCB arranged in a first direction and a second direction crossing the first direction.

A counting signal CNT may be generated by the random code generator 400 by counting oscillations of a clock signal CLK during a power-up sequence of the semiconductor memory device 200 (operation S110).

The random code RDCD may be generated by the random code generator 400 by latching the counting signal CNT based on a second signal generated in response to an end of the power-up sequence (operation S130). The second signal may belong to a second domain different from a first domain to which the clock signal UK belongs, where the second domain may be associated with a frequency of the second signal and the first domain may be associated with a frequency of the UK signal.

Data bits of data input and/or output to and/or from a second group of sub array blocks SCB from among a first group of sub array blocks SCB may be scrambled based on the random code RDCD (operation S150). The first group of sub array blocks may be arranged in the first direction among from the plurality of sub array blocks.

Therefore, the semiconductor memory device according to an embodiment of the inventive concept may generate a counting signal by counting oscillations of a first signal belonging to a first domain, and may generate a random code by latching the counting signal based on a second signal belonging to a second domain different from the first domain.

In addition, the semiconductor memory device may select, based on the random code, a second group of I/O sense amplifiers, Which may perform data scrambling, from among from first group of I/O sense amplifiers associated with inputting/outputting first data bits. The second group of I/O sense amplifiers may scramble data bits to be stored in a memory cell array and may store the scrambled data bits in the memory cell array. Therefore, the semiconductor memory device may reduce noise, which may occur when more data bits having first logic levels than data bits having second logic levels are stored in the memory cell array.

Figure 25:
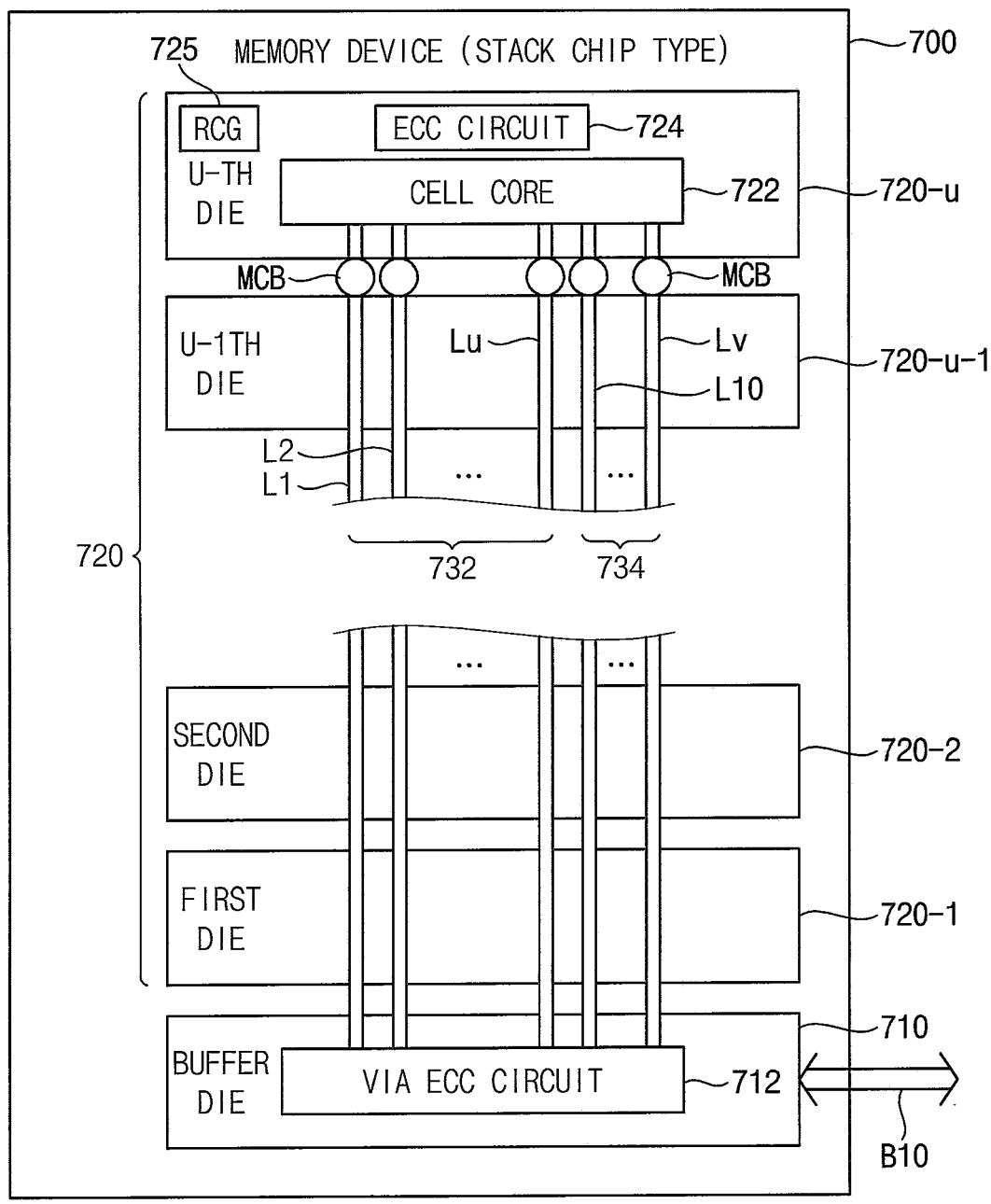
FIG. 25 is a block diagram of a semiconductor memory device according to an embodiment of the inventive concept.

FIG. 25 is a block diagram of a semiconductor memory device according to an embodiment of the inventive concept.

Referring to FIG. 25, a semiconductor memory device 700 may include a buffer die (or a logic die) 710 and a plurality of dies 720 which may provide a soft error analyzing and correcting function. The buffer die 710 and the plurality of dies 720 may be arranged in a stacked chip structure.

The plurality of dies 720 may include a plurality of memory dies 720-1 to 720-u, where u may be a natural number greater than two, which may be stacked on the buffer die 710. The plurality of memory dies 720-1 to 720-u may convey data through a plurality of through-substrate (or through-silicon) via (TSV lines. When a TSV is formed in a die formed with a silicon substrate, the TSV may be referred to as a through silicon via. A TSV line of the plurality of TSV lines may fully extend through a die in which it is formed or may only partially penetrate the die through a substrate of the die to form a via (electrical) connection from a backside of the die to an upper surface of the substrate corresponding to the active surface side of the die on which the integrated circuit may be formed.

Each of the memory dies 720-1 to 720-u may include a cell core 722, an ECC circuit 724, and a random code generator (RCG) 725. The cell core 722 may include a memory cell array including a plurality of sub array blocks arranged in a first direction and a second direction crossing the first direction and I/O sense amplifiers corresponding to the sub array blocks arranged in the second direction.

The ECC, circuit 724 may be referred to as an error correction circuit and may employ the error correction circuit 330 of FIG. 23.

Therefore, in the semiconductor memory device 700, the random code generator 725 may generate a counting signal by counting oscillations of a first signal belonging to a first domain, and may generate a random code by latching the counting signal based on a second signal belonging to a second domain different from the first domain, where the second domain may be associated with a frequency of the second signal and the first domain may be associated with a frequency of the first signal. Therefore, randomness of the random code may be secured.

In addition, a second group of I/O sense amplifiers, which may perform data scrambling, may be selected, based on the random code, from among a first group of I/O sense amplifiers associated with inputting/outputting first data bits. The second group of I/O sense amplifiers may scramble data bits to be stored in the cell core 722 and may store the scrambled data bits in the cell core 722. Therefore, the semiconductor memory device 700 may reduce core noise which may occur when more data bits having first logic levels are stored in the cell core 722 than data bits having second logic levels.

The buffer die 710 may include a via ECC circuit 712 which may correct a transmission error with transmission parity bits when a transmission error is detected from transmission data received through the plurality of TSV lines and may generate error-corrected data. The via ECC circuit 712 may be referred to as a via error correction circuit.

The semiconductor memory device 700 may be a stack chip type memory device or a stacked memory device which may convey data and control signals through the plurality of TSV lines. The plurality of TSV lines may also be called through electrodes.

In a comparative example, a transmission error in transmission data may occur due to noise which may be present in TSV lines. Since data transmission failure due to TSV line noise may be distinguishable from data transmission failure due to a false operation of a memory die, the former may be regarded as a soft data transmission failure (or a soft error). The soft data transmission failure may occur due to transmission failure on a transmission path. In contrast with the comparative example, a soft data transmission failure may be detected and remedied by G ala ECC operation of an embodiment of the inventive concept.

A data TSV line group 732, which may be formed at one memory die 720-u, may include TSV lines L1 to Lu of the plurality of TSV lines, and a parity TSV line group 734 may include TSV lines L10 to Lv of the plurality of TSV lines.

The TSV lines L1 to Lu of the data TSV line group 732 and the parity TSV lines L10 to Lv of the parity TSV line group 734 may be connected to micro bumps MCB which may be correspondingly formed among the memory dies 720-1 to 720-u.

Each of the memory dies 720-1 to 720-u may include DRAM cells each including at least one access transistor and at least one storage capacitor.

The semiconductor memory device 700 may have a three-dimensional (3D) chip structure or a 2.5D chip structure and may communicate with a memory controller through a data bus B10. The buffer die 710 may be connected to the memory controller through the data bus B10.

The via ECC circuit 712 may determine whether a transmission error occurs in the transmission data received through the data TSV line group 732 based on the transmission parity bits received through the parity TSV line group 734.

When a transmission error is detected, the via ECC circuit 712 may correct the transmission error on the transmission data with the transmission parity bits. When the transmission error may not be corrected, the via ECC circuit 712 may output information indicating occurrence of an uncorrectable data error.

Figure 26:
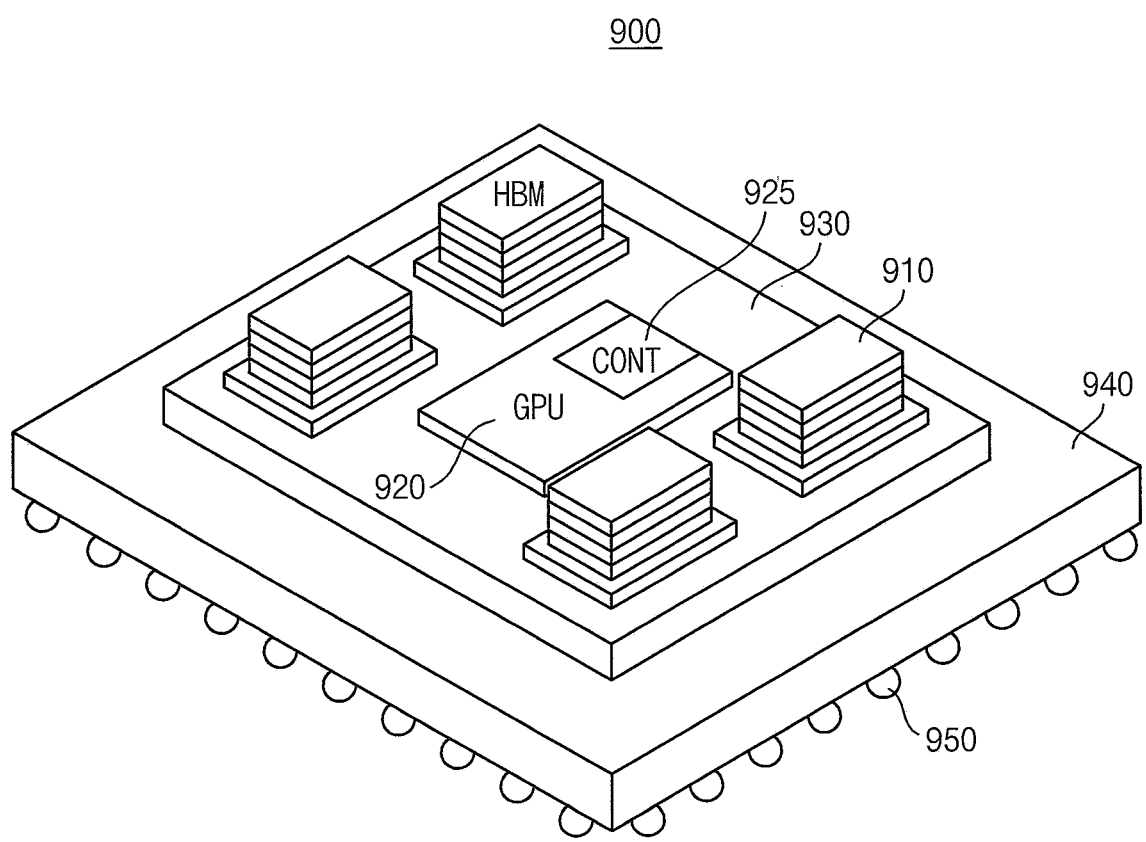
FIG. 26 is a diagram of a semiconductor package including a stacked memory device according to an embodiment of the inventive concept.

FIG. 26 is a diagram of a semiconductor package including a stacked memory device according to some example embodiments.

Referring to FIG. 26, a semiconductor package 900 may include one or more stacked memory devices 910 and a graphic processing unit (GPU) 920 ( ). The GPU 920 may include a memory controller 925.

The stacked memory devices 910 and the GPU 920 may be mounted on an interposer 930, and the interposer may be mounted on a package substrate 940. The package substrate 940 may be mounted on solder balls 950. The memory controller 925 may be implemented as the memory controller 100 of FIG. 1.

Each of the stacked memory devices 910 may be implemented in various forms, and may be a memory device in a high bandwidth memory (HBM) form in which a plurality of layers may be stacked. Accordingly, each of the stacked memory devices 910 may include a buffer die and a plurality of memory dies, and each of the plurality of memory dies may include a memory cell array, a plurality of I/O sense amplifiers, and a random code generator.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

The random code generator may be implemented as the random code generator 400. As described above, the random code generator may generate a counting signal by counting a first signal belonging to a first domain, and may generate a random code by latching the counting signal based on a second signal belonging to a second domain different from the first domain, where the second domain may be associated with a frequency of the second signal and the first domain may be associated with a frequency of the first signal. Therefore, randomness of the random code maybe secured.

In addition, a second group of I/O sense amplifiers, which may perform data scrambling, may be selected, based on the random code, from among a first group of I/O sense amplifiers associated with inputting/outputting first data bits. The second group of I/O sense amplifiers may scramble data bits to be stored in a cell core included in the semiconductor package 900 and may store the scrambled data bits in the cell core. Therefore, the semiconductor package 900 may reduce core noise which may occur when more data bits having first logic levels are stored in the cell core than data bits having second logic levels.

Embodiments of the inventive concept may be applied to semiconductor memory devices and memory systems employing open bit line configurations. For example, embodiments of the inventive concept may be applied to systems such as a smart phone, a navigation system, a notebook computer, a desk top computer, a game console, and the like that use a semiconductor memory device as a working memory.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. A semiconductor memory device, comprising:
    a memory cell array including a plurality of sub array blocks arranged in a first direction and a second direction crossing the first direction;
    a sense amplifier circuit arranged in the first direction, the sense amplifier circuit including a plurality of input/output (I/O) sense amplifiers corresponding to the sub array blocks arranged in the second direction; and
    a random code generator configured to generate a random code which is randomly determined based on a power stabilizing signal and an anti-fuse flag signal, the power stabilizing signal indicating that an operating voltage generated based on an external voltage received during a power-up sequence of the semiconductor memory has reached a reference voltage level, the anti-fuse flag signal indicating that information associated with an anti-fuse circuit of the semiconductor memory device has been transferred,
    wherein the sense amplifier circuit further includes a random code decoder configured to generate and output a scramble signal by decoding the random code,
    wherein a first group of I/O sense amplifiers from among the plurality of I/O sense amplifiers is configured to perform a data I/O operation on main data,
    wherein the first group of I/O sense amplifiers corresponds to a first group of sub array blocks from among the plurality of sub array blocks,
    wherein the first group of sub array blocks is accessed via an access address, and
    wherein a second group of I/O sense amplifiers is selected from among the first group of I/O sense amplifiers and is configured to perform the data I/O operation by data scrambling data bits of the main data.

2. The semiconductor memory device of claim 1, wherein the random code generator includes:
    an oscillator configured to generate a clock signal during an initial interval of the power-up sequence in response to the power stabilizing signal;
    a counter circuit configured to generate a counting signal by counting oscillations of the clock signal;
    a latch circuit configured to provide a latched counting signal by latching the counting signal based on the anti-fuse flag signal; and
    a selection circuit configured to select one of the latched counting signal and a test code in response to a selection signal and to output the selected latched counting signal or the selected test code as the random code.

3. The semiconductor memory device of claim 2, wherein the clock signal belongs to a first domain associated with a frequency of the clock signal, the anti-fuse flag signal belongs to a second domain different from the first domain and associated with a frequency of the anti-fuse flag signal, and
    wherein the random code has randomness based on at least one of a difference between a manufacturing process associated with the oscillator and the anti-fuse circuit, a difference between a voltage applied to the oscillator and to the anti-fuse circuit, and a difference between a temperature of the oscillator and of the anti-fuse circuit.

4. The semiconductor memory device of claim 2,
    wherein the counting signal includes a first counting bit and a second counting bit, and
    wherein the counter circuit includes:
    a first flip-flop configured to output the first counting bit by latching the first counting bit at a falling edge of the clock signal; and
    a second flip-flop configured to output the second counting bit by latching the second counting bit at a falling edge of the first counting hit.

5. The semiconductor memory device of claim 4, wherein the latch circuit includes:
    a third flip-flop configured to output a first latched counting bit of the latched counting signal by latching the first counting bit based on a first falling edge of the anti-fuse flag signal; and
    a fourth flip-flop configured to output a second latched counting bit of the latched counting signal by latching the second counting bit based on a second falling edge of the anti-fuse flag.

6. The semiconductor memory device of claim 5, wherein:
    the random code includes a first random bit and a second random bit;

the second group of I/O sense amplifiers is selected based on logic levels of the first random bit and the second random hit; and
the first group of I/O sense amplifiers includes first through eighth I/O sense amplifiers.

7. The semiconductor memory device of claim 6, wherein the first group receives a scramble signal, the logic level of the first random bit is low and the logic level of the second random bit is low, and two I/O sense amplifiers of the first group are selected for the second group.

8. The semiconductor memory device of claim 6, wherein the first group receives a scramble signal, the logic level of the first random bit is low and the logic level of the second random bit is high logic level, and four I/O sense amplifiers of the first group are selected for the second group.

9. The semiconductor memory device of claim 6, wherein the first group receives a scramble signal, the logic level of the first random bit is high and the logic level of the second random bit is low, and six I/O sense amplifiers of the first group are selected for the second group.

10. The semiconductor memory device of claim 6, wherein the first group receives a scramble signal, the logic level of the first random bit is high and the logic level of the second random hit is high, and eight I/O sense amplifiers of the first group are selected for the second group.

11. The semiconductor memory device of claim 5, wherein the ant-fuse flag signal transitions to a low level in response to an end of the power-up sequence.

12. The semiconductor memory device of claim 2, wherein:
the random code generator is configured to retain random bits in the random code during a normal operation of the semiconductor memory device; and
the random code generator is configured to update, the random bits in the random code in a warm boot or a cold boot of the semiconductor memory device.

13. The semiconductor memory device of claim 1, wherein:
the sub array blocks in the second directions include odd sub array blocks alternatingly arranged with even sub array blocks.

14. The semiconductor memory device of claim 13, wherein the second group of I/O sense amplifiers are configured to provide non-inverted data bits associated with the even sub array blocks in response to receiving the scramble signal.

15. The semiconductor memory device of claim 13, wherein the second group of I/O sense amplifiers are configured to provide inverted data bits associated with the odd sub array blocks in response to receiving the scramble signal.

16. The semiconductor memory device of claim 15, wherein I/O sense amplifiers not included in the second group of I/O sense amplifiers are configured to provide inverted data bits associated with the even sub array blocks in response to receiving the scramble signal.

17. The semiconductor memory device of claim 1, further comprising a voltage generator configured to:
generate the operating voltage based on the external voltage; and
generate the power stabilizing signal by detecting a level of the external voltage.

18. The semiconductor memory device of claim 1, wherein:
the memory cell array includes a plurality of bank arrays;
wherein each of the plurality of bank arrays includes the sub array blocks and the sense amplifier circuit; and the random code generator is configured to generate a first random code or a second random code different from the first random code for the plurality of bank arrays.

19. A method of operating a semiconductor memory device, the method comprising:
generating, by a random code generator included in the semiconductor memory device and during a power-up sequence of the semiconductor memory device, a counting signal by counting oscillations of a clock signal;
generating, by the random code generator, a random code by latching the counting signal based on a signal generated in response to an end of the power-up sequence, the signal belonging to a second domain different from a first domain to which the clock signal belongs; and
scrambling data bits of data input to and/or output from a second group of sub array blocks selected from among a first group of sub array blocks based on the random code,
wherein the first group of sub array blocks are included in a plurality of sub array blocks included in a memory cell array of the semiconductor memory device,
wherein the plurality of sub array blocks are arranged in a first direction and a second direction crossing the first direction, and
wherein the first group of sub array blocks are arranged in the second direction.

20. A semiconductor memory device, comprising:
a memory cell array including a plurality of sub array blocks arranged in a first direction and a second direction crossing the first direction;
a sense amplifier circuit arranged in the first direction the sense amplifier circuit including a plurality of input/output (I/O) sense amplifiers corresponding to the sub array blocks arranged in the second direction; and
a random code generator configured to generate a random code which is randomly determined based on a power stabilizing signal and an anti-fuse flag signal, the power stabilizing signal indicating that an operating voltage generated based on an external voltage received during a power-up sequence of the semiconductor memory device has reached a reference voltage level, the anti-fuse flag signal indicating that information associated with an anti-fuse circuit of the semiconductor memory device has been transferred,
wherein:
a first group of I/O sense amplifiers from among the plurality of I/O sense amplifiers is configured to perform a data I/O operation on main data;
the first group of I/O sense amplifiers corresponds to a first group of sub array blocks from among the plurality of sub array blocks;
the first group of sub array blocks is accessed via an access address;
a second group of I/O sense amplifiers is selected from among the first group of I/O sense amplifiers, and is configured to perform the data I/O operation by data scrambling data bits of the main data; and
the random code generator includes:
an oscillator configured to generate a clock signal during an initial interval of the power-up sequence in response to the power stabilizing signal;
a counter circuit configured to generate a counting signal by counting oscillations of the clock signal;

a latch circuit configured to provide a latched counting signal by latching the counting signal based on the anti-fuse flag signal; and a selection circuit configured to select one of the latched counting signal and a test code in response to a selection signal and to output the selected latched counting signal or the selected test code as the random code.

* * * * *